(12) United States Patent
Nishimura et al.

(10) Patent No.: US 9,695,281 B2
(45) Date of Patent: Jul. 4, 2017

(54) TRIAZINE RING-CONTAINING POLYMER AND MEMBRANE-FORMING COMPOSITION CONTAINING THE SAME

(75) Inventors: Naoya Nishimura, Funabashi (JP); Masaaki Ozawa, Funabashi (JP); Yasuyuki Koide, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 523 days.

(21) Appl. No.: 13/818,577

(22) PCT Filed: Aug. 23, 2011

(86) PCT No.: PCT/JP2011/068937
§ 371 (c)(1),
(2), (4) Date: May 6, 2013

(87) PCT Pub. No.: WO2012/026452
PCT Pub. Date: Mar. 1, 2012

(65) Prior Publication Data
US 2013/0214372 A1 Aug. 22, 2013

(30) Foreign Application Priority Data
Aug. 25, 2010 (JP) ................................ 2010-187770

(51) Int. Cl.
C08G 73/06 (2006.01)
H05B 33/10 (2006.01)
(Continued)

(52) U.S. Cl.
CPC ....... *C08G 73/0644* (2013.01); *C08G 73/026* (2013.01); *C08G 73/0273* (2013.01);
(Continued)

(58) Field of Classification Search
CPC .............. C08G 73/0644; C08G 73/026; C08G 73/0273; C08G 73/06; C09K 11/06;
(Continued)

(56) References Cited

U.S. PATENT DOCUMENTS 5,886,130 A 3/1999 Trimmer et al.
6,316,619 B1 11/2001 Miyake et al.
(Continued)

FOREIGN PATENT DOCUMENTS

CN 101643651 A 2/2010
CN 101717396 A * 6/2010
(Continued)

OTHER PUBLICATIONS

Machine translate English language equivalent of DE 19528822 (Feb. 1997, 10 pages).*
(Continued)

*Primary Examiner* — Brieann R Fink
(74) *Attorney, Agent, or Firm* — Birch, Stewart, Kolasch & Birch, LLP

(57) ABSTRACT

Disclosed is a triazine ring-containing hyperbranched polymer containing a repeating unit structure represented by the expression (1). By this means, it is possible to achieve a triazine ring-containing polymer which, alone, has high heat
(Continued)

resistance, high transparency, high refractive index, high light resistance, high solubility, low volume shrinkage without adding metal oxides; and also a membrane-forming composition containing the same.

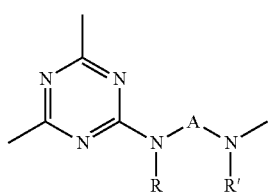

(1)

In the formula, R and R' represent independently a hydrogen atom, an alkyl group, an alkoxy group, an aryl group, or an aralkyl group, and A represents an alkylene group optionally having a branched or alicyclic structure of 1 to 20 carbon atoms.

9 Claims, 11 Drawing Sheets

(51) Int. Cl.
 C08G 73/02 (2006.01)
 C09K 11/06 (2006.01)
 G02B 5/22 (2006.01)
 H01L 31/0232 (2014.01)
(52) U.S. Cl.
 CPC .............. *C09K 11/06* (2013.01); *G02B 5/223* (2013.01); *H01L 31/0232* (2013.01); *H05B 33/10* (2013.01); *C09K 2211/1425* (2013.01); *C09K 2211/1433* (2013.01); *C09K 2211/1466* (2013.01)
(58) Field of Classification Search
 CPC .... C09K 2211/1425; C09K 2211/1433; G02B 5/223; H05B 33/10; H01L 31/0232
 USPC .......................................... 528/423; 524/612
 See application file for complete search history.

(56) References Cited

U.S. PATENT DOCUMENTS

| | | | | |
|---|---|---|---|---|
| 6,512,124 | B1 * | 1/2003 | Baek ................... | C07D 209/48 548/476 |
| 2008/0176146 | A1 * | 7/2008 | Tomita .................. | G03F 7/033 430/2 |
| 2009/0281215 | A1 | 11/2009 | Kaul | |
| 2009/0318725 | A1 | 12/2009 | Takeuchi | |
| 2010/0137539 | A1 * | 6/2010 | Lai ....................... | C08G 83/002 526/261 |

FOREIGN PATENT DOCUMENTS

| | | | |
|---|---|---|---|
| CN | 101717396 A | | 6/2010 |
| CN | 101880400 A | * | 11/2010 |
| DE | 195 28 882 A1 | | 2/1997 |
| DE | 19528882 A1 | * | 2/1997 |
| DE | 196 21 741 A1 | | 12/1997 |
| DE | 19621741 A1 | * | 12/1997 |
| JP | 51-42800 A | | 4/1976 |
| JP | 55-98180 A | | 7/1980 |
| JP | 7-113009 A | | 5/1995 |
| JP | 10-109987 A | | 4/1998 |
| JP | 10-287745 A | | 10/1998 |
| JP | 11-5790 A | | 1/1999 |
| JP | 2000-53659 A | | 2/2000 |
| JP | 2002-53666 A | | 2/2002 |
| JP | 2007-246877 A | | 9/2007 |
| JP | 2008-24832 A | | 2/2008 |
| JP | 2009-280810 A | | 12/2009 |
| WO | WO 98/11150 A1 | | 3/1998 |
| WO | WO 2007091031 A2 | * | 8/2007 ........... H01L 27/307 |

OTHER PUBLICATIONS

Mahapatra (Hyperbranched Aromatic Polyamines with s-Trizaine Rings. Journal of Applied Polymer Science. (106). 2007, pp. 95-102).*
Machine translated English language equivalent of CN 101717396 (Jun. 2010, 9 pages).*
Machine translated English language equivalent of CN 101880400 (Nov. 2010, 7 pages).*
International Search Report issued in PCT/JP2011/068937 mailed Nov. 8, 2011.
Extended European Search Report issued Apr. 10, 2014, in European Patent Application No. 11819915.7.

* cited by examiner

TRIAZINE RING-CONTAINING POLYMER AND MEMBRANE-FORMING COMPOSITION CONTAINING THE SAME

TECHNICAL FIELD

The present invention relates to a triazine ring-containing polymer and a film-forming composition containing the same. More specifically, the invention relates to a triazine ring-containing hyperbranched polymer and a film-forming composition containing such a polymer.

BACKGROUND ART

Various efforts have hitherto been made to increase the functionality of polymeric compounds. For example, in one approach currently used to increase the refractive index of polymeric compounds, aromatic rings, halogen atoms or sulfur atoms are introduced onto the compound. Of such compounds, episulfide polymeric compounds and thiourethane polymeric compounds, both of which have sulfur atoms introduced thereon, are in practical use today as high-refractive index lenses for eyeglasses.

The most effective way to achieve even higher refractive indices in polymeric compounds is known to involve the use of inorganic metal compounds.

For example, a method for increasing the refractive index by using a hybrid material composed of a siloxane polymer mixed with a material containing small dispersed particles of zirconia, titania or the like has been disclosed (Patent Document 1).

A method in which a condensed ring skeleton having a high refractive index is introduced onto portions of a siloxane polymer has also been disclosed (Patent Document 2).

In addition, numerous attempts have been made to impart heat resistance to polymeric compounds. Specifically, it is well known that the heat resistance of polymeric compounds can be improved by introducing aromatic rings. For example, polyarylene copolymers with substituted arylene recurring units on the backbone have been disclosed (Patent Document 3). Such polymeric compounds show promise primarily in use as heat-resistant plastics.

Melamine resins are familiar as triazine resins, but have a very low decomposition temperature compared with heat-resistant materials such as graphite.

The heat-resistant organic materials composed of carbon and nitrogen that have been in use up until now are for the most part aromatic polyimides and aromatic polyamides. However, because these materials have straight-chain structures, their heat-resistance temperatures have not been all that high.

Triazine-based condensation materials have also been reported as nitrogen-containing polymeric materials having heat resistance (Patent Document 4).

In recent years, there has arisen a need for high-performance polymeric materials in the development of electronic devices such as liquid-crystal displays, organic electroluminescent (EL) displays, optical semiconductor (LED) devices, solid-state image sensors, organic thin-film solar cells, dye-sensitized solar cells and organic thin-film transistors (TFT).

The specific properties desired in such polymeric materials are (1) heat resistance, (2) transparency, (3) high refractive index, (4) light resistance, (5) high solubility, and (6) low volume shrinkage. In optical materials in particular, there is a desire for improved resistance to deterioration by light, i.e., light resistance. In order to increase the light resistance, studies aimed at, for example, preventing deterioration by the addition of ultraviolet absorbers or by the introduction of functional groups having stable radicals have been carried out. However, there are few examples of polymeric compounds which are inherently endowed with a high light resistance.

PRIOR ART DOCUMENTS

Patent Documents

Patent Document 1: JP-A 2007-246877
Patent Document 2: JP-A 2008-24832
Patent Document 3: U.S. Pat. No. 5,886,130
Patent Document 4: JP-A 2000-53659

SUMMARY OF THE INVENTION

Problems to be Solved by the Invention

It is therefore an object of the present invention to provide a triazine ring-containing polymer of excellent light resistance, which polymer is able by itself, without the addition of a metal oxide, to achieve a high heat resistance, high transparency, high refractive index, high light resistance, high solubility and low volume shrinkage. A further object of the invention is to provide a film-forming composition containing such a polymer.

Means for Solving the Problems

The inventors earlier discovered that hyperbranched polymers containing recurring units having a triazine ring and an aromatic ring are able, with the polymer alone, to achieve a high heat resistance, high transparency, high refractive index, high solubility and low volume shrinkage, and are thus suitable as film-forming compositions in the fabrication of electronic devices (International Application PCT/JP 2010/057761).

Based on these findings, the inventors have conducted further investigations and discovered that by giving the aromatic ring moiety an acyclic aliphatic or alicyclic structure, a polymer having an excellent light resistance can be obtained.

Accordingly, the invention provides:
1. A triazine ring-containing hyperbranched polymer characterized by including a recurring unit structure of formula (1) below

[Chemical Formula 1]

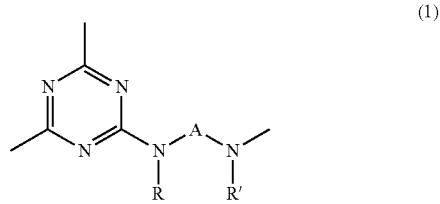

(1)

(wherein R and R' are each independently a hydrogen atom or an alkyl, alkoxy, aryl or aralkyl group; and A is an alkylene group which may have a branched or alicyclic structure of 1 to 20 carbons).
2. The triazine ring-containing hyperbranched polymer according to 1 above, wherein A is an alkylene group having an alicyclic structure of 3 to 20 carbons.

3. The triazine ring-containing hyperbranched polymer according to 1 above, wherein A is at least one moiety selected from the group consisting of moieties of formulas (2) to (14) below

[Chemical Formula 2]

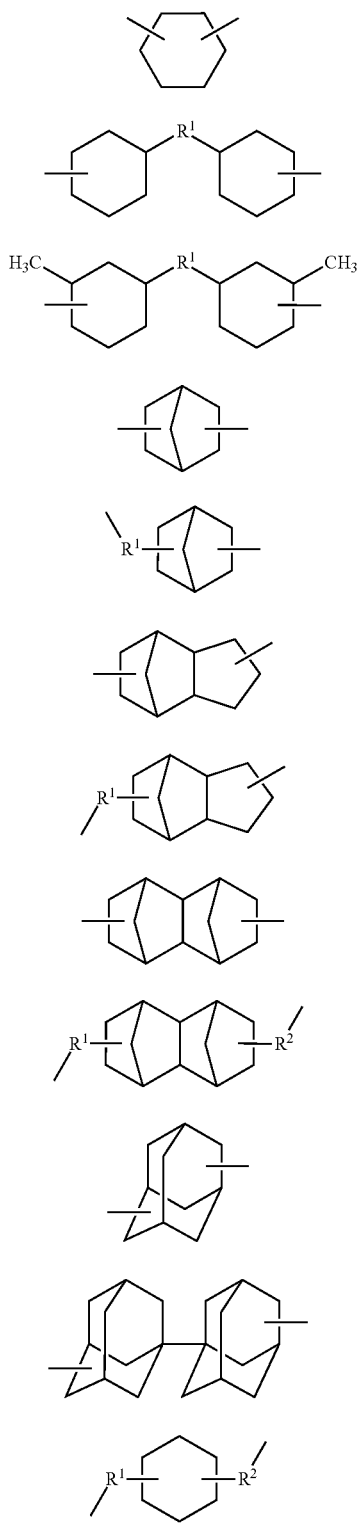

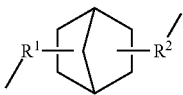

($R^1$ and $R^2$ being each independently an alkylene group which may have a branched structure of 1 to 5 carbons).

4. The triazine ring-containing hyperbranched polymer according to 3 above, wherein A has formula (2).

5. The triazine ring-containing hyperbranched polymer according to 1 above, wherein the recurring unit structure has formula (15) below.

[Chemical Formula 3]

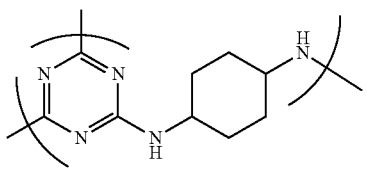

6. The triazine ring-containing hyperbranched polymer according to 1 above, wherein the recurring unit structure has formula (16) below.

[Chemical Formula 4]

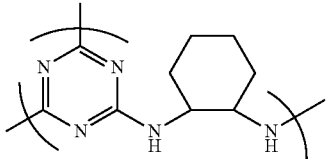

7. The triazine ring-containing hyperbranched polymer according to any one of 1 to 6 above, wherein the polymer is capped on at least one end by an alkyl, aralkyl, aryl, alkylamino, alkoxysilyl-containing alkylamino, aralkylamino, arylamino, alkoxy, aralkyloxy, aryloxy or ester group.

8. The triazine ring-containing hyperbranched polymer according to 7 above, wherein the polymer has at least one terminal triazine ring which is capped by an alkyl, aralkyl, aryl, alkylamino, alkoxysilyl-containing alkylamino, aralkylamino, arylamino, alkoxy, aralkyloxy, aryloxy or ester group.

9. A film-forming composition which includes the triazine ring-containing hyperbranched polymer of any one of 1 to 8 above.

10. A film which includes the triazine ring-containing hyperbranched polymer of any one of 1 to 8 above.

11. A film obtained from the film-forming composition of 9 above.

12. An electronic device having a base material and the film of 10 or 11 above formed on the base material.

13. An optical member having a base material and the film of 10 or 11 above formed on the base material.

14. A solid-state image sensor formed of a charge-coupled device or complementary metal oxide semiconductor, which sensor includes at least one layer of the film of 10 or 11 above.

15. A solid-state image sensor having the film of 10 or 11 above as a planarization layer on a color filter.

16. A lens material, planarizing material or embedding material for a solid-state image sensor, wherein the material includes the triazine ring-containing hyperbranched polymer of any one of 1 to 8 above.

Advantageous Effect of the Invention

This invention makes it possible to provide a triazine ring-containing polymer which is capable of achieving, by itself: high heat resistance, high transparency, high refractive index, high light resistance, high solubility and low volume shrinkage.

By employing the above polymer skeleton, a high heat resistance and a high transparency can be maintained even in cases where (1) a secondary amine is used as a polymer spacer, and (2) a primary amine is substituted at the chain ends.

The physical properties of the triazine ring-containing hyperbranched polymer used in the invention can be controlled by varying the types of monomers serving as the starting material at the time of synthesis.

Films containing the triazine ring-containing hyperbranched polymer of the invention having characteristics such as those mentioned above can be advantageously used as components in the fabrication of electronic devices such as liquid-crystal displays, organic electroluminescent (EL) displays, optical semiconductor (LED) devices, solid-state image sensors, organic thin-film solar cells, dye-sensitized solar cells and organic thin-film transistors (TFT). Such films can also be advantageously used as lens components required to have a high refractive index. In particular, such films can be advantageously used as the following solid-state image sensor components which are required to have especially high refractive indices: embedding films and planarizing films on photodiodes, planarizing films before and after color filters, microlenses, planarizing films on microlenses, conformal films, and also coating materials and sealants for LEDs.

EMBODIMENT FOR CARRYING OUT THE INVENTION

Figure 1:
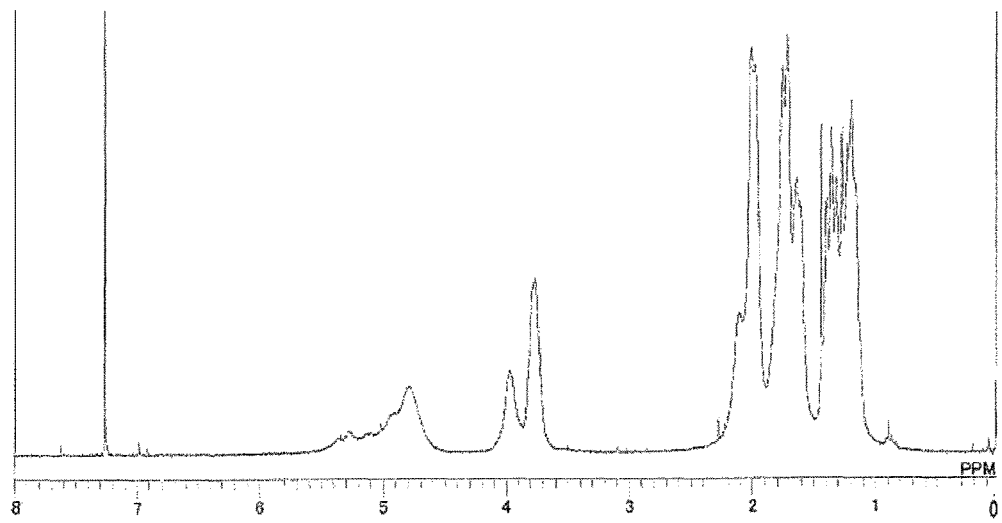
FIG. 1 is an $^1$H-NMR spectrum of the hyperbranched polymer [3] obtained in Example 1.

The invention is described more fully below.

The triazine ring-containing hyperbranched polymer according to the present invention includes a recurring unit structure of formula (1) below.

[Chemical Formula 5]

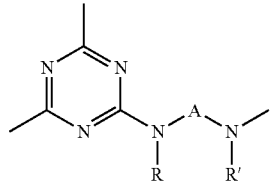

(1)

In the above formula, R and R' are each independently a hydrogen atom or an alkyl, alkoxy, aryl or aralkyl group.

In the invention, the number of carbons on the alkyl group, although not particularly limited, is preferably from 1 to 20. From the standpoint of further increasing the heat resistance of the polymer, the number of carbons is more preferably from 1 to 10, and even more preferably from 1 to 3. The alkyl group may have a linear, branched or cyclic structure.

Illustrative examples of alkyl groups include methyl, ethyl, n-propyl, isopropyl, cyclopropyl, n-butyl, isobutyl, s-butyl, t-butyl, cyclobutyl, 1-methylcyclopropyl, 2-methylcyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methylcyclobutyl, 2-methylcyclobutyl, 3-methylcyclobutyl, 1,2-dimethylcyclopropyl, 2,3-dimethylcyclopropyl, 1-ethylcyclopropyl, 2-ethylcyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methylcyclopentyl, 2-methylcyclopentyl, 3-methylcyclopentyl, 1-ethylcyclobutyl, 2-ethylcyclobutyl, 3-ethylcyclobutyl, 1,2-dimethylcyclobutyl, 1,3-dimethylcyclobutyl, 2,2-dimethylcyclobutyl, 2,3-dimethylcyclobutyl, 2,4-dimethylcyclobutyl, 3,3-dimethylcyclobutyl, 1-n-propylcyclopropyl, 2-n-propylcyclopropyl, 1-isopropylcyclopropyl, 2-isopropylcyclopropyl, 1,2,2-trimethylcyclopropyl, 1,2,3-trimethylcyclopropyl, 2,2,3-trimethylcyclopropyl, 1-ethyl-2-methylcyclopropyl, 2-ethyl-1-methylcyclopropyl, 2-ethyl-2-methylcyclopropyl and 2-ethyl-3-methylcyclopropyl.

The number of carbons on the alkoxy group, although not particularly limited, is preferably from 1 to 20. From the standpoint of further increasing the heat resistance of the polymer, the number of carbons is more preferably from 1 to 10, and even more preferably from 1 to 3. The alkyl moiety thereon may have a linear, branched or cyclic structure.

Illustrative examples of alkoxy groups include methoxy, ethoxy, n-propoxy, isopropoxy, n-butoxy, isobutoxy, s-butoxy, t-butoxy, n-pentoxy, 1-methyl-n-butoxy, 2-methyl-n-butoxy, 3-methyl-n-butoxy, 1,1-dimethyl-n-propoxy, 1,2-dimethyl-n-propoxy, 2,2-dimethyl-n-propoxy, 1-ethyl-n-propoxy, n-hexyloxy, 1-methyl-n-pentyloxy, 2-methyl-n-pentyloxy, 3-methyl-n-pentyloxy, 4-methyl-n-pentyloxy, 1,1-dimethyl-n-butoxy, 1,2-dimethyl-n-butoxy, 1,3-dimethyl-n-butoxy, 2,2-dimethyl-n-butoxy, 2,3-dimethyl-n-butoxy, 3,3-dimethyl-n-butoxy, 1-ethyl-n-butoxy, 2-ethyl-n-butoxy, 1,1,2-trimethyl-n-propoxy, 1,2,2-trimethyl-n-propoxy, 1-ethyl-1-methyl-n-propoxy and 1-ethyl-2-methyl-n-propoxy.

The number of carbons on the aryl group, although not particularly limited, is preferably from 6 to 40. From the standpoint of further increasing the heat resistance of the polymer, the number of carbons is more preferably from 6 to 16, and even more preferably from 6 to 13.

Illustrative examples of aryl groups include phenyl, o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, α-naphthyl, β-naphthyl, o-biphenylyl, m-biphenylyl, p-biphenylyl, 1-anthryl, 2-anthryl, 9-anthryl, 1-phenanthryl, 2-phenanthryl, 3-phenanthryl, 4-phenanthryl and 9-phenanthryl.

The number of carbons on the aralkyl group, although not particularly limited, is preferably from 7 to 20. The alkyl moiety thereon may be linear, branched or cyclic.

Illustrative examples of aralkyl groups include benzyl, p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl, 4-isobutylphenylmethyl and α-naphthylmethyl.

In above formula (1), A is an alkylene group which may have a branched or alicyclic structure of 1 to 20 carbons and is not otherwise limited, although an alkylene group having an alicyclic structure of 3 to 20 carbons is preferred.

The alkylene group is exemplified by linear or branched alkylene groups such as methylene, ethylene, propylene, trimethylene, tetramethylene and pentamethylene, and also alkylene groups having alicyclic structures like those shown in formulas (2) to (14) below. From the standpoint of further increasing the light resistance of the polymer obtained, alkylene groups having the alicyclic structures shown in formulas (2) to (14) are preferred, with the cyclohexylene group shown in formula (2) being especially preferred.

[Chemical Formula 6]

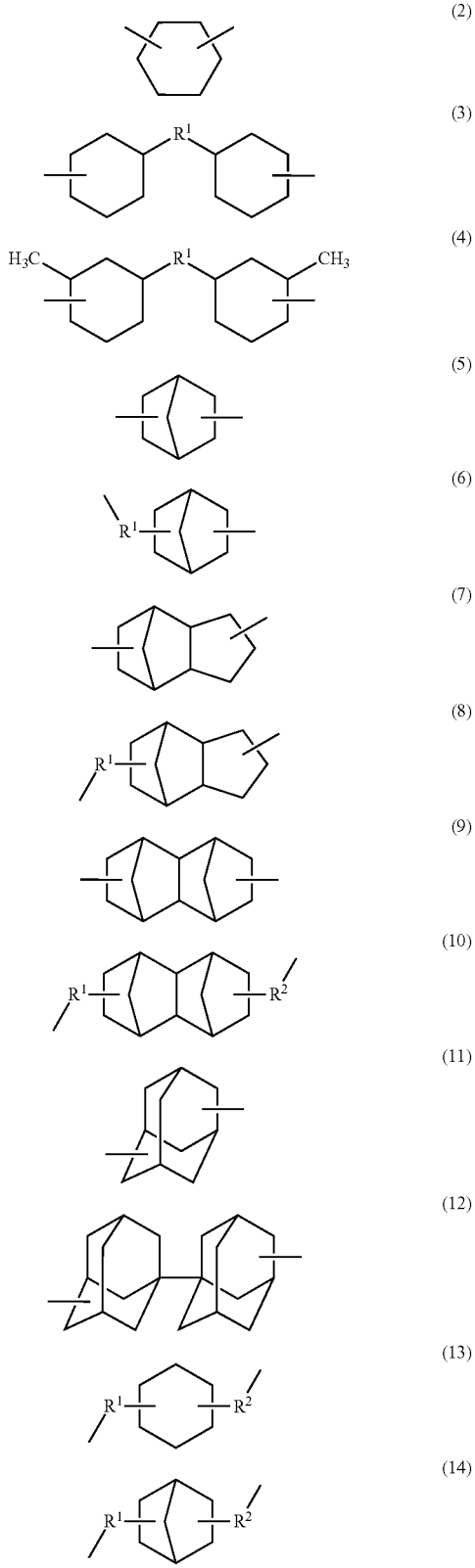

$R^1$ and $R^2$ are each independently an alkylene group which may have a branched structure of 1 to 5 carbons.

Illustrative examples of such alkylene groups include methylene, ethylene, propylene, trimethylene, tetramethylene and pentamethylene. From the standpoint of further increasing the refractive index of the polymer obtained, an alkylene groups having 1 to 3 carbons is preferred, an alkylene groups having 1 to 2 carbons (i.e., methylene, ethylene) is more preferred, and methylene is most preferred.

Examples of preferred recurring unit structures include, but are not limited to, those of formulas (15) and (16) below.

[Chemical Formula 7]

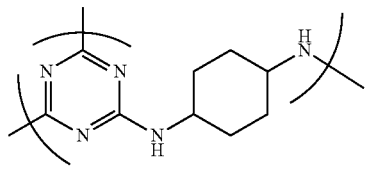

(15)

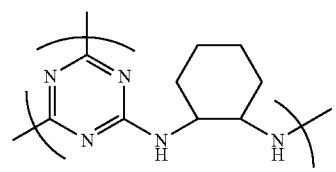

(16)

The hyperbranched polymer of the invention has a weight-average molecular weight which, although not particularly limited, is preferably between 400 and 500,000, and more preferably between 400 and 100,000. To further enhance the heat resistance and lower the shrinkage ratio, the weight-average molecular weight is preferably at least 600. To further increase the solubility and lower the viscosity of the resulting solution, the weight-average molecular weight is preferably 50,000 or less, more preferably 30,000 or less, and even more preferably 10,000 or less.

The weight-average molecular weight in the invention is the weight-average molecular weight measured by gel permeation chromatography (GPC) against a polystyrene standard.

Exemplary methods of preparing the triazine ring-containing hyperbranched polymer used in the invention are described.

For example, as shown in Scheme 1 below, a hyperbranched polymer having the recurring structure (15') can be obtained by reacting a cyanuric halide (17) with a 1,4-diaminocyclohexane compound (18) in a suitable organic solvent.

Scheme 1

[Chemical Formula 8]

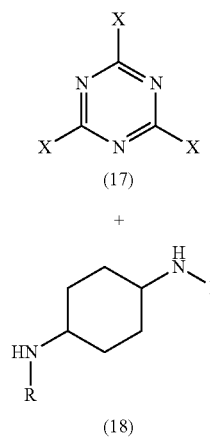

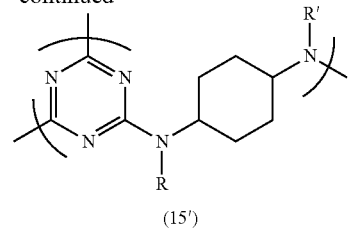

(15')

In the above formulas, each occurrence of X is independently a halogen atom; and R and R' are as defined above.

Alternatively, as shown in Scheme 2 below, a hyperbranched polymer having the recurring structure (15') can be synthesized from a compound (19) obtained by reacting equimolar amounts of a cyanuric halide (17) and a 1,4-diaminocyclohexane compound (18) in a suitable organic solvent.

Scheme 2

[Chemical Formula 9]

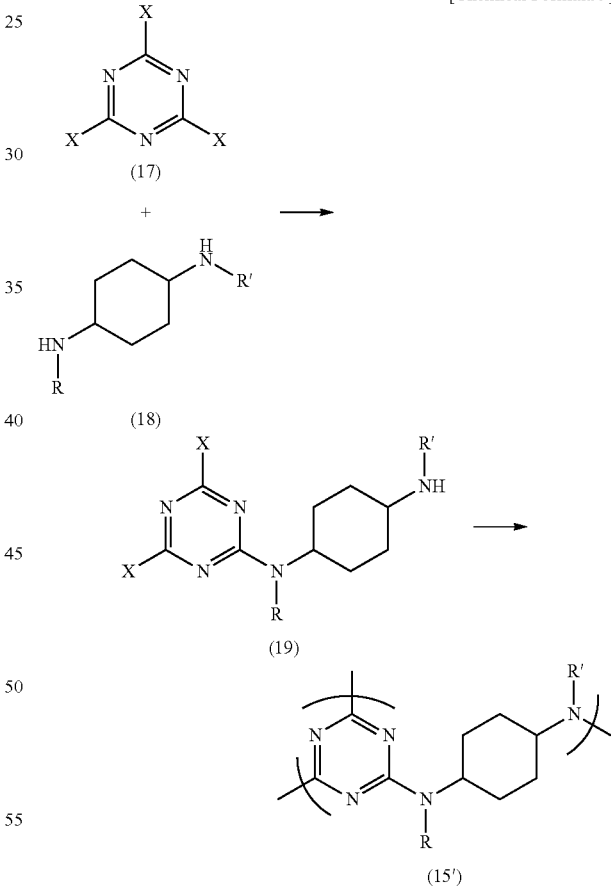

In the above formulas, each occurrence of X is independently a halogen atom; and R and R' are as defined above.

By using the above methods, the hyperbranched polymer of the invention can be easily and safely produced at a low cost. Because the reaction time in these methods is much shorter than in the synthesis of ordinary polymers, these production methods are compatible with recent concerns for the environment and are capable of reducing $CO_2$ emissions.

Moreover, such methods can carry out stable production even when the scale of production is greatly expanded, and thus allow a stable supply system to be maintained even at an industrial level.

In particular, taking into account the stability of cyanuric chloride as a starting material and also from an industrial perspective, the production method of Scheme 2 is more preferred.

In the methods of Schemes 1 and 2, the respective starting materials may be charged in any suitable amounts so long as the target hyperbranched polymer is obtained, although the use of from 0.01 to 10 equivalents of the diamino compound (18) per equivalent of the cyanuric halide (17) is preferred.

In the method of Scheme 1 in particular, it is preferable to avoid using 3 equivalents of the diamino compound (18) per 2 equivalents of the cyanuric halide (17). By having the number of equivalents of the respective functional groups differ from this ratio, the formation of a gel can be prevented.

To obtain hyperbranched polymers of various molecular weights which have many terminal triazine rings, it is preferable to use the diamino compound (18) in an amount of less than 3 equivalents per 2 equivalents of the cyanuric halide (17).

On the other hand, to obtain hyperbranched polymers of various molecular weights which have many terminal amines, it is preferable to use the cyanuric halide (17) in an amount of less than 2 equivalents per 3 equivalents of the diamino compound (18).

For example, in cases where a thin film has been produced, in order for the film to have an excellent transparency and light resistance, a hyperbranched polymer having many terminal triazine rings is preferred.

By suitably regulating the amounts of the diamino compound (18) and the cyanuric halide (17) in this way, the molecular weight of the resulting hyperbranched polymer can easily be regulated.

Various solvents that are commonly used in this type of reaction may be used as the organic solvent. Illustrative examples include tetrahydrofuran (THF), 1,4-dioxane, dimethylsulfoxide; amide solvents such as N,N-dimethylformamide, N-methyl-2-pryrrolidone, tetramethylurea, hexamethylphosphoramide, N,N-dimethylacetamide, N-methyl-2-piperidone, N,N-dimethylethyleneurea, N,N,N',N'-tetramethylmalonamide, N-methylcaprolactam, N-acetylpyrrolidine, N,N-diethylacetamide, N-ethyl-2-pyrrolidone, N,N-dimethylpropionamide, N,N-dimethylisobutyramide, N-methylformamide and N,N'-dimethylpropyleneurea; and mixed solvents thereof.

Of the above, THF, 1,4-dioxane, N,N-dimethylacetamide, N-methyl-2-pyrrolidone, dimethylsulfoxide and mixed solvents thereof are preferred. 1,4-Dioxane is especially preferred.

In the Scheme 1 reaction and the second stage reaction in Scheme 2, the reaction temperature may be suitably set in the range from the melting point of the solvent used to the boiling point of the solvent, although the temperature is preferably from about 0° C. to about 150° C., and more preferably from 60 to 100° C.

In the Scheme 1 reaction in particular, to suppress linearity and increase the degree of branching, the reaction temperature is preferably from 60 to 150° C., more preferably from 80 to 150° C., and even more preferably from 80 to 120° C.

In the first stage reaction of Scheme 2, the reaction temperature may be suitably set in the range from the melting point of the solvent used to the boiling point of the solvent, with a temperature of from about −50 to about 50° C. being preferred, a temperature of from about −20 to about 50° C. being more preferred, a temperature of from about −10 to about 50° C. being even more preferred, and a temperature of from −10 to 10° C. being still more preferred.

In the Scheme 2 method in particular, the use of a two-stage process with a first step involving reaction at from −50 to 50° C., followed by a second step involving reaction at from 60 to 150° C. is preferred.

In each of the above reactions, the ingredients may be added in any order. However, in the Scheme 1 reaction, the best method is to heat a solution containing either the cyanuric halide (17) or the diamino compound (18) and the organic solvent to a temperature of from 60 to 150° C., and preferably from 80 to 150° C., then add the remaining ingredient—the diamino compound (18) or the cyanuric halide (17)—to the resulting solution at this temperature.

In this case, either ingredient may be used as the ingredient which is initially dissolved in the solvent or as the ingredient which is subsequently added, although a method wherein the cyanuric halide (17) is added to a heated solution of the diamino compound (18) is preferred.

In the Scheme 2 reactions, either ingredient may be used as the ingredient which is initially dissolved in the solvent or as the ingredient which is subsequently added, although a method wherein the diamino compound (18) is added to a cooled solution of the cyanuric halide (17) is preferred.

The subsequently added ingredient may be added neat or may be added as a solution of the ingredient dissolved in an organic solvent such as any of those mentioned above. However, taking into account the ease of the operations and the controllability of the reaction, the latter approach is preferred.

Also, addition may be carried out gradually such as in a dropwise manner, or the entire amount may be added all at once in a batchwise manner.

In Scheme 1, even in cases where the reaction is carried out in a single stage (without raising the temperature in a stepwise fashion), in a heated state and after both compounds have been mixed, the desired triazine ring-containing hyperbranched polymer can be obtained without gelation.

In the Scheme 1 reaction and the second stage reaction in Scheme 2, various bases which are commonly used during or after polymerization may be added.

Illustrative examples of such bases include potassium carbonate, potassium hydroxide, sodium carbonate, sodium hydroxide, sodium bicarbonate, sodium ethoxide, sodium acetate, lithium carbonate, lithium hydroxide, lithium oxide, potassium acetate, magnesium oxide, calcium oxide, barium hydroxide, trilithium phosphate, trisodium phosphate, tripotassium phosphate, cesium fluoride, aluminum oxide, ammonia, trimethylamine, triethylamine, diisopropylmethylamine, diisopropylethylamine, N-methylpiperidine, 2,2,6,6-tetramethyl-N-methylpiperidine, pyridine, 4-dimethylaminopyridine and N-methylmorpholine.

The amount of base added per equivalent of the cyanuric halide (17) is preferably from 1 to 100 equivalents, and more preferably from 1 to 10 equivalents. These bases may also be used in the form of an aqueous solution.

Although it is preferable for no starting ingredients to remain in the resulting polymer, some starting material may remain, provided this does not interfere with the advantageous effects of the invention.

In the methods of both schemes, following reaction completion, the product can be easily purified by a suitable technique such as reprecipitation.

Also, in the present invention, some portion of the halogen atoms on at least one terminal triazine ring may be capped by, for example, an alkyl, aralkyl, aryl, alkylamino, alkoxysilyl-containing alkylamino, aralkylamino, arylamino, alkoxy, aralkyloxy, aryloxy or ester group.

Of these, alkylamino, alkoxysilyl-containing alkylamino, aralkylamino and arylamino groups are preferred. Alkylamino and arylamino groups are more preferred.

Illustrative examples of ester groups include methoxycarbonyl and ethoxycarbonyl.

Illustrative examples of alkylamino groups include methylamino, ethylamino, n-propylamino, isopropylamino, n-butylamino, isobutylamino, s-butylamino, t-butylamino, n-pentylamino, 1-methyl-n-butylamino, 2-methyl-n-butylamino, 3-methyl-n-butylamino, 1,1-dimethyl-n-propylamino, 1,2-dimethyl-n-propylamino, 2,2-dimethyl-n-propylamino, 1-ethyl-n-propylamino, n-hexylamino, 1-methyl-n-pentylamino, 2-methyl-n-pentylamino, 3-methyl-n-pentylamino, 4-methyl-n-pentylamino, 1,1-dimethyl-n-butylamino, 1,2-dimethyl-n-butylamino, 1,3-dimethyl-n-butylamino, 2,2-dimethyl-n-butylamino, 2,3-dimethyl-n-butylamino, 3,3-dimethyl-n-butylamino, 1-ethyl-n-butylamino, 2-ethyl-n-butylamino, 1,1,2-trimethyl-n-propylamino, 1,2,2-trimethyl-n-propylamino, 1-ethyl-1-methyl-n-propylamino and 1-ethyl-2-methyl-n-propylamino.

Illustrative examples of aralkylamino groups include benzylamino, methoxycarbonylphenylmethylamino, ethoxycarbonylphenylmethylamino, p-methylphenylmethylamino, m-methylphenylmethylamino, o-ethylphenylmethylamino, m-ethylphenylmethylamino, p-ethylphenylmethylamino, 2-propylphenylmethylamino, 4-isopropylphenylmethylamino, 4-isobutylphenylmethylamino, naphthylmethylamino, methoxycarbonylnaphthylmethylamino and ethoxycarbonylnaphthylmethylamino.

Illustrative examples of arylamino groups include phenylamino, methoxycarbonylphenylamino, ethoxycarbonylphenylamino, naphthylamino, methoxycarbonylnaphthylamino, ethoxycarbonylnaphthylamino, anthranylamino, pyrenylamino, biphenylamino, terphenylamino and fluorenylamino.

Alkoxysilyl-containing alkylamino groups are exemplified by monoalkoxysilyl-containing alkylamino groups, dialkoxysilyl-containing alkylamino groups and trialkoxysilyl-containing alkylamino groups. Illustrative examples include 3-trimethoxysilylpropylamino, 3-triethoxysilylpropylamino, 3-dimethylethoxysilylpropylamino, 3-methyldiethoxysilylpropylamino, N-(2-aminoethyl)-3-dimethylmethoxysilylpropylamino, N-(2-aminoethyl)-3-methyldimethoxysilylpropylamino and N-(2-aminoethyl)-3-trimethoxysilylpropylamino.

Illustrative examples of aryloxy groups include phenoxy, naphthoxy, anthranyloxy, pyrenyloxy, biphenyloxy, terphenyloxy and fluorenyloxy.

Illustrative examples of aralkyloxy groups include benzyloxy, p-methylphenylmethyloxy, m-methylphenylmethyloxy, o-ethylphenylmethyloxy, m-ethylphenylmethyloxy, p-ethylphenylmethyloxy, 2-propylphenylmethyloxy, 4-isopropylphenylmethyloxy, 4-isobutylphenylmethyloxy and α-naphthylmethyloxy.

Alkyl groups, aralkyl groups, aryl groups and alkoxy groups are exemplified in the same way as described earlier in the specification.

These groups can be easily introduced by substituting a halogen atom on a triazine ring with a compound that furnishes the corresponding substituent. For example, as shown in Scheme 3 below, by adding an aniline derivative and inducing a reaction, a hyperbranched polymer (20) having a phenylamino group on at least one chain end is obtained.

Scheme 3

[Chemical Formula 10]

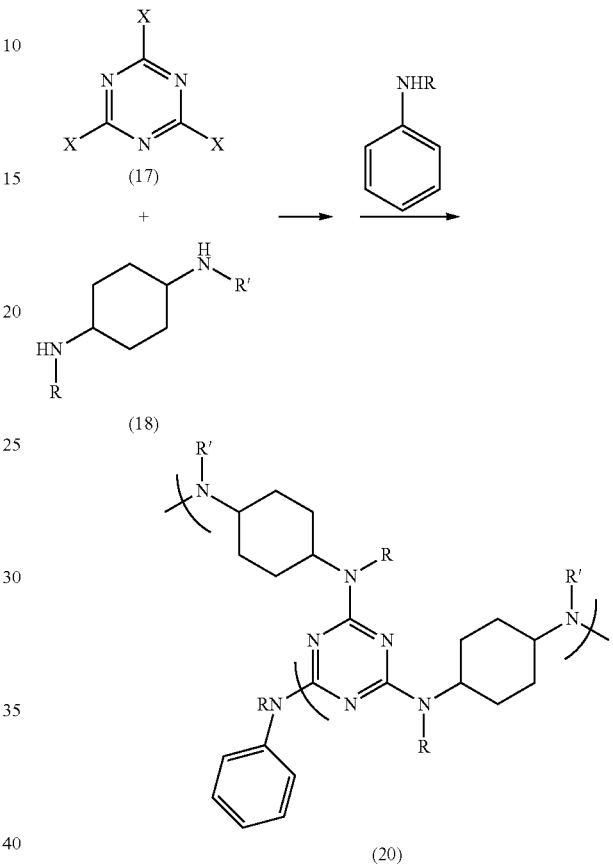

In these formulas, X, R and R' are as defined above.

At this time, by reacting the cyanuric halide with a diaminoaryl compound while concurrently charging an organic monoamine, i.e., in the presence of an organic monoamine, it is possible to obtain a flexible hyperbranched polymer having a low degree of branching in which the rigidity of the hyperbranched polymer has been reduced.

Because the hyperbranched polymer obtained in this way has an excellent solubility in a solvent (meaning that aggregation is inhibited) and has an excellent crosslinkability with a crosslinking agent, it is especially advantageous when used as a composition in combination with the subsequently described crosslinking agent.

An alkyl monoamine, aralkyl monoamine or aryl monoamine may be used here as the organic monoamine.

Illustrative examples of alkyl monoamines include methylamine, ethylamine, n-propylamine, isopropylamine, n-butylamine, isobutylamine, s-butylamine, t-butylamine, n-pentylamine, 1-methyl-n-butylamine, 2-methyl-n-butylamine, 3-methyl-n-butylamine, 1,1-dimethyl-n-propylamine, 1,2-dimethyl-n-propylamine, 2,2-dimethyl-n-propylamine, 1-ethyl-n-propylamine, n-hexylamine, cyclohexylamine, 1-methyl-n-pentylamine, 2-methyl-n-pentylamine, 3-methyl-n-pentylamine, 4-methyl-n-pentylamine, 1,1-dimethyl-n-butylamine, 1,2-dimethyl-n-butylamine, 1,3-dimethyl-n-butylamine, 2,2-dimethyl-n-butylamine, 2,3-dimethyl-n-butylamine, 3,3-dimethyl-n-butylamine, 1-ethyl-n-butylamine, 2-ethyl-n-butylamine, 1,1,2-trimethyl-n-propylamine, 1,2,2-trimethyl-n-propylamine, 1-ethyl-1-methyl-n-propylamine, 1-ethyl-2-methyl-n-propylamine and 2-ethylhexylamine.

Illustrative examples of aralkyl monoamines include benzylamine, p-methoxycarbonylbenzylamine, p-ethoxycarbonylbenzylamine, p-methylbenzylamine, m-methylbenzylamine and o-methoxybenzylamine.

Illustrative examples of aryl monoamines include aniline, p-methoxycarbonylaniline, p-ethoxycarbonylaniline, p-methoxyaniline, 1-naphthylamine, 2-naphthylamine, anthranylamine, 1-aminopyrene, 4-biphenylylamine, o-phenylaniline, 4-amino-p-terphenyl and 2-aminofluorene.

In this case, the amount of organic monoamine used per equivalent of the cyanuric halide is set to preferably from 0.05 to 500 equivalents, more preferably from 0.05 to 120 equivalents, and even more preferably from 0.05 to 50 equivalents.

To suppress linearity and increase the degree of branching, the reaction temperature in this case is preferably from 60 to 150° C., more preferably from 80 to 150° C., and even more preferably from 80 to 120° C.

However, mixing of the three ingredients—an organic monoamine, a cyanuric halide and a diamino compound—may be carried out at a low temperature, in which case the temperature is set to preferably from about −50° C. to about 50° C., more preferably from about −20° C. to about 50° C., and even more preferably from about −20° C. to about 10° C. By carrying out the reaction while concurrently charging such an organic monoamine, the refractive index of the resulting hyperbranched polymer can be further increased. Following low-temperature charging, it is preferable to raise the temperature without interruption (in a single step) to the polymerization temperature and carry out the reaction.

Alternatively, the mixing of two ingredients—a cyanuric halide and a diamine compound—may be carried out at a low temperature, in which case the temperature is set to preferably from about −50° C. to about 50° C., more preferably from about −20° C. to about 50° C., and even more preferably from about −20° C. to about 10° C. Following low-temperature charging, it is preferable to raise the temperature without interruption (in a single step) to the polymerization temperature and carry out the reaction.

The reaction of the cyanuric halide with the diamino compound in the presence of such an organic monoamine may be carried out using an organic solvent like that described above.

The film-forming composition of the invention must include the above-described triazine ring-containing hyperbranched polymer, and may also include other ingredients, such as a leveling agent, a surfactant and a crosslinking agent, provided this does not interfere with the advantageous effects of the invention.

Illustrative examples of surfactants include the following nonionic surfactants: polyoxyethylene alkyl ethers such as polyoxyethylene lauryl ether, polyoxyethylene stearyl ether, polyoxyethylene cetyl ether and polyoxyethylene oleyl ether; polyoxyethylene alkylaryl ethers such as polyoxyethylene octylphenol ether and polyoxyethylene nonylphenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; and additionally include fluorosurfactants such as those available under the trade names Eftop EF301, EF303 and EF352 (from Mitsubishi Materials Electronic Chemicals Co., Ltd. (formerly Jemco Inc.)), Megafac F171, F173, R-08 and R-30 (DIC Corporation), Fluorad FC430 and FC431 (Sumitomo 3M, Ltd.), AsahiGuard AG710 and Surflon S-382, SC101, SC102, SC103, SC104, SC105 and SC106 (Asahi Glass Co., Ltd.); and also the organosiloxane polymers KP341 (Shin-Etsu Chemical Co., Ltd.) and BYK-302, BYK-307, BYK-322, BYK-323, BYK-330, BYK-333, BYK-370, BYK-375 and BYK-378 (BYK-Chemie Japan KK).

These surfactants may be used singly or two or more may be used in combination. The amount of surfactant used per 100 parts by weight of the hyperbranched polymer is preferably from 0.0001 to 5 parts by weight, more preferably from 0.001 to 1 part by weight, and even more preferably from 0.01 to 0.5 part by weight.

The crosslinking agent is not particularly limited, provided it is a compound having a substituent capable of reacting with the hyperbranched polymer of the invention.

Such compounds are exemplified by melamine compounds having a crosslink-forming substituent such as a methylol group or a methoxymethyl group, substituted urea compounds, compounds containing a crosslink-forming substituent such as an epoxy group or an oxetane group, compounds containing a blocked isocyanate group, compounds having an acid anhydride group, compounds having a (meth)acryl group, and phenoplast compounds. From the standpoint of heat resistance and storage stability, a compound containing an epoxy group, a blocked isocyanate group or a (meth)acryl group is preferred.

A blocked isocyanate group is also preferred in that, because it crosslinks by forming a urea linkage and has a carbonyl group, the refractive index does not decrease.

When used in the treatment of polymer chain ends, it suffices for these compounds to have at least one crosslink-forming substituent; however, when used in crosslinking treatment between polymers, they must have at least two crosslink-forming substituents.

The epoxy compound has at least two epoxy groups on the molecule. Upon exposure of this compound to an elevated temperature during heat curing, the epoxy rings open and the crosslinking reaction proceeds via an addition reaction with the hyperbranched polymer used in the invention.

Illustrative examples of the crosslinking agent include tris(2,3-epoxypropyl)isocyanate, 1,4-butanediol diglycidyl ether, 1,2-epoxy-4-(epoxyethyl)cyclohexane, glycerol triglycidyl ether, diethylene glycol diglycidyl ether, 2,6-diglycidylphenyl glycidyl ether, 1,1,3-tris[p-(2,3-epoxypropoxy)phenyl]propane, 1,2-cyclohexanedicarboxylic acid diglycidyl ester, 4,4'-methylenebis(N,N-diglycidylaniline), 3,4-epoxycyclohexylmethyl-3,4-epoxycyclohexanecarboxylate, trimethylolethane triglycidyl ether, bisphenol A diglycidyl ether and pentaerythritol polyglycidyl ether.

Examples of commercial products that may be used include epoxy resins having at least two epoxy groups, such as YH-434 and YH-434L (from Tohto Kasei Co., Ltd.); epoxy resins having a cyclohexene oxide structure, such as Epolead GT-401, GT-403, GT-301 and GT-302, and also Celloxide 2021 and Celloxide 3000 (all from Daicel Chemical Industries, Ltd.); bisphenol A-type epoxy resins such as Epikote (now "jER") 1001, 1002, 1003, 1004, 1007, 1009, 1010 and 828 (all from Japan Epoxy Resin Co., Ltd.); bisphenol F-type epoxy resins such as Epikote (now "jER")

807 (Japan Epoxy Resin Co., Ltd.); phenol-novolak type epoxy resins such as Epikote (now "jER") 152 and 154 (Japan Epoxy Resin Co., Ltd.), and EPPN 201 and 202 (Nippon Kayaku Co., Ltd.); cresol-novolak type epoxy resins such as EOCN-102, EOCN-103S, EOCN-104S, EOCN-1020, EOCN-1025 and EOCN-1027 (Nippon Kayaku Co., Ltd.), and Epikote (now "jER") 180S75 (Japan Epoxy Resin Co., Ltd.); alicyclic epoxy resins such as Denacol EX-252 (Nagase ChemteX Corporation), CY175, CY177 and CY179 (Ciba-Geigy AG), Araldite CY-182, CY-192 and CY-184 (Ciba-Geigy AG), Epiclon 200 and 400 (DIC Corporation), Epikote (now "jER") 871 and 872 (Japan Epoxy Resin Co., Ltd.), and ED-5661 and ED-5662 (Celanese Coating KK); and aliphatic polyglycidyl ethers such as Denacol EX-611, EX-612, EX-614, EX-622, EX-411, EX-512, EX-522, EX-421, EX-313, EX-314 and EX-321 (Nagase ChemteX Corporation).

The acid anhydride compound is a carboxylic acid anhydride obtained by carrying out a dehydration/condensation reaction between two carboxylic acid molecules. Upon exposure to an elevated temperature during heat curing, the anhydride ring opens and the crosslinking reaction proceeds by way of an addition reaction with the hyperbranched polymer used in this invention.

Illustrative examples of the acid anhydride compound include compounds having a single acid anhydride group on the molecule, such as phthalic anhydride, tetrahydrophthalic anhydride, hexahydrophthalic anhydride, methyl tetrahydrophthalic anhydride, methyl hexahydrophthalic anhydride, nadic anhydride, methyl nadic anhydride, maleic anhydride, succinic anhydride, octyl succinic anhydride and dodecenyl succinic anhydride; and compounds having two acid anhydride groups on the molecule, such as 1,2,3,4-cyclobutanetetracarboxylic, dianhydride, pyromellitic anhydride, 3,4-dicarboxy-1,2,3,4-tetrahydro-1-naphthalenesuccinic dianhydride, bicyclo[3.3.0]octane-2,4,6,8-tetracarboxylic dianhydride, 5-(2,5-dioxotetrahydro-3-furanyl)-3-methyl-3-cyclohexene-1,2-dicarboxylic anhydride, 1,2,3,4-butanetetracarboxylic dianhydride, 3,3',4,4'-benzophenonetetracarboxylic dianhydride, 3,3',4,4'-biphenyltetracarboxylic dianhydride, 2,2-bis(3,4-dicarboxyphenyl)hexafluoropropane dianhydride and 1,3-dimethyl-1,2,3,4-cyclobutanetetracarboxylic dianhydride.

The (meth)acrylic compound is a compound having two or more (meth)acryl groups on the molecule. Upon exposure to an elevated temperature during heat curing, the crosslinking reaction proceeds by way of an addition reaction with the hyperbranched polymer used in the invention.

Illustrative examples of the compound having (meth)acryl groups include ethylene glycol diacrylate, ethylene glycol dimethacrylate, polyethylene glycol diacrylate, polyethylene glycol dimethacrylate, ethoxylated bisphenol A diacrylate, ethoxylated bisphenol A dimethacrylate, ethoxylated trimethylolpropane triacrylate, ethoxylated trimethylolpropane trimethacrylate, ethoxylated glycerol triacrylate, ethoxylated glycerol trimethacrylate, ethoxylated pentaerythritol tetraacrylate, ethoxylated pentaerythritol tetramethacrylate, ethoxylated dipentaerythritol hexaacrylate, polyglycerol monoethylene oxide polyacrylate, polyglycerol polyethylene glycol polyacrylate, dipentaerythritol hexaacrylate, dipentaerythritol hexamethacrylate, neopentyl glycol diacrylate, neopentyl glycol dimethacrylate, pentaerythritol triacrylate, pentaerythritol trimethacrylate, trimethylolpropane triacrylate, trimethylolpropane trimethacrylate, tricyclodecane dimethanol diacrylate, tricyclodecane dimethanol dimethacrylate, 1,6-hexanediol diacrylate and 1,6-hexanediol dimethacrylate.

The above compound having (meth)acryl groups may be acquired as a commercial product, illustrative examples of which include NK Ester A-200, A-400, A-600, A-1000, A-TMPT, UA-53H, 1G, 2G, 3G, 4G, 9G, 14G, 23G, ABE-300, A-BPE-4, A-BPE-6, A-BPE-10, A-BPE-20, A-BPE-30, BPE-80N, BPE-100N, BPE-200, BPE-500, BPE-900, BPE-1300N, A-GLY-3E, A-GLY-9E, A-GLY-20E, A-TMPT-3EO, A-TMPT-9EO, ATM-4E and ATM-35E (all from Shin-Nakamura Chemical Co., Ltd.); KAYARAD™ DPEA-12, PEG400DA, THE-330 and RP-1040 (all from Nippon Kayaku Co., Ltd.); M-210 and M-350 (from Toagosei Co., Ltd.); KAYARAD™ DPHA, NPGDA and PET30 (Nippon Kayaku Co., Ltd.); and NK Ester A-DPH, A-TMPT, A-DCP, A-HD-N, TMPT, DCP, NPG and HD-N (all from Shin-Nakamura Chemical Co., Ltd.).

The compound containing blocked isocyanate groups is a compound having on the molecule at least two blocked isocyanate groups, i.e., isocyanate groups (—NCO) that have been blocked with a suitable protecting group, and in which, upon exposure of the compound to an elevated temperature during heat curing, the protecting groups (blocking moieties) are removed by thermal dissociation and the isocyanate groups that form as a result induce crosslinking reactions with the resin. This compound is exemplified by compounds having on the molecule at least two groups of the following formula (which groups may be the same or may each differ).

[Chemical Formula 11]

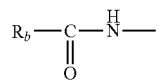

In the formula, $R_b$ is an organic group on the blocking moiety.

Such a compound can be obtained by, for example, reacting a suitable blocking agent with a compound having at least two isocyanate groups on the molecule.

Illustrative examples of compounds having at least two isocyanate groups on the molecule include polyisocyanates such as isophorone diisocyanate, 1,6-hexamethylene diisocyanate, methylenebis(4-cyclohexyl isocyanate) and trimethylhexamethylene diisocyanate, and also dimers and trimers thereof, as well as the reaction products of these with diols, triols, diamines or triamines.

Illustrative examples of the blocking agent include alcohols such as methanol, ethanol, isopropanol, n-butanol, 2-ethoxyhexanol, 2-N,N-dimethylaminoethanol, 2-ethoxyethanol and cyclohexanol; phenols such as phenol, o-nitrophenol, p-chlorophenol, and o-, m- or p-cresol; lactams such as s-caprolactam; oximes such as acetone oxime, methyl ethyl ketone oxime, methyl isobutyl ketone oxime, cyclohexanone oxime, acetophenone oxime and benzophenone oxime; pyrazoles such as pyrazole, 3,5-dimethylpyrazole and 3-methylpyrazole; and thiols such as dodecanethiol and benzenethiol.

The compound containing blocked isocyanates may also be acquired as a commercial product, illustrative examples of which include B-830, B-815N, B-842N, B-870N, B-874N, B-882N, B-7005, B7030, B-7075 and B-5010 (all from Mitsui Chemicals Polyurethane, Inc.); Duranate™ 17B-60PX, TPA-B80E, MF-B60X, MF-K60X and E402-B80T (all from Asahi Kasei Chemicals Corporation); and KarenzMOI-BM™ (Showa Denko KK).

Aminoplast compounds are compounds which have at least two methoxymethylene groups on the molecule. Upon exposure to an elevated temperature during heat curing, crosslinking reactions proceed by way of demethanolization/condensation reactions with the hyperbranched polymer used in the invention.

Illustrative examples of melamine compounds include the Cymel series, such as hexamethoxymethylmelamine (Cymel™ 303), tetrabutoxymethylglycoluril (Cymel™ 1170) and tetramethoxymethylbenzoguanamine (Cymel™ 1123) (all from Nihon Cytec Industries, Inc.); and the Nikalac™ series, including the methylated melamine resins Nikalac™ MW-30HM, MW-390, MW-100LM and MX-750LM, and the methylated urea resins Nikalac™ MX-270, MX-280 and MX-290 (all from Sanwa Chemical Co., Ltd.).

Oxetane compounds are compounds which have at least two oxetanyl groups on the molecule. Upon exposure to an elevated temperature during heat curing, crosslinking reactions proceed by way of addition reactions with the hyperbranched polymer used in the invention.

Examples of compounds having oxetane groups include the oxetane group-bearing compounds OXT-221, OX-SQ-H and OX-SC (from Toagosei Co., Ltd.).

Phenoplast compounds are compounds which have at least two hydroxymethylene groups on the molecule. Upon exposure to an elevated temperature during heat curing, crosslinking reactions proceed by way of dehydration/condensation reactions with the hyperbranched polymer used in the invention.

Illustrative examples of phenoplast compounds include 2,6-dihydroxymethyl-4-methylphenol, 2,4-dihydroxymethyl-6-methylphenol, bis(2-hydroxy-3-hydroxymethyl-5-methylphenyl)methane, bis(4-hydroxy-3-hydroxymethyl-5-methylphenyl)methane, 2,2-bis(4-hydroxy-3,5-dihydroxymethylphenyl)propane, bis(3-formyl-4-hydroxyphenyl)methane, bis(4-hydroxy-2,5-dimethylphenyl)formylmethane and α,α-bis(4-hydroxy-2,5-dimethylphenyl)-4-formyltoluene.

The phenoplast compound may also be acquired as a commercial product, illustrative examples of which include 26DMPC, 46DMOC, DM-BIPC-F, DM-BIOC-F, TM-BIP-A, RISA-F, BI25X-DF and BI25X-TPA (all from Asahi Organic Chemicals Industry Co., Ltd.).

These crosslinking agents may be used singly or two or more may be used in combination. The amount of crosslinking agent used per 100 parts by weight of the hyperbranched polymer is preferably from 1 to 100 parts by weight. From the standpoint of the solvent resistance, the lower limit is preferably 10 parts by weight, and more preferably 20 parts by weight. From the standpoint of control of the refractive index, the upper limit is preferably 50 parts by weight, and more preferably 30 parts by weight.

When a crosslinking agent is used, the crosslinking agent reacts with reactive end-group substituents on the hyperbranched polymer, which may make it possible to achieve such advantageous effects as increasing the film density, increasing the heat resistance and increasing the thermal relaxation properties.

Ingredients other than the above may also be added in any step during preparation of the inventive composition.

The film-forming composition of the invention, by being applied onto a base material and subsequently heated where necessary, is able to form a desired film.

Any suitable method may be used for applying the composition, such as spin coating, dipping, flow coating, inkjet printing, spraying, bar coating, gravure coating, slit coating, roll coating, transfer printing, brush coating, blade coating and air knife coating.

Illustrative examples of the base material include silicon, indium-tin oxide (ITO)-coated glass, indium zinc oxide (IZO)-coated glass, polyethylene terephthalate (PET), plastic, glass, quartz and ceramic. Use can also be made of a flexible base material having pliability.

The temperature at which baking is carried out in order to evaporate the solvent is not subject to any particular limitation. For example, baking may be carried out at between 40 and 400° C. In such cases, to achieve more uniform film formability or to induce the reaction to proceed on the base material, temperature change may be carried out in two or more stages.

The baking process is not particularly limited. For example, solvent evaporation may be effected using a hot plate or an oven, and under a suitable atmosphere, such as in open air, in nitrogen or another inert gas, or in a vacuum.

As for the bake temperature and time, conditions which are compatible with the processing steps for the target electronic device should be selected. Bake conditions such that the physical values of the resulting film conform to the required characteristics of the electronic device should be selected.

Because the film made of the inventive composition that has been obtained in this way is able to achieve a high heat resistance, high transparency, high refractive index, high light resistance, high solubility and low volume shrinkage, it can be advantageously used as a component in the fabrication of electronic devices such as liquid-crystal displays, organic electroluminescent (EL) displays, optical semiconductor (LED) devices, solid-state image sensors, organic thin-film solar cells, dye-sensitized solar cells and organic thin-film transistors (TFT).

Where necessary, other resins (thermoplastic resins or thermoset resins) may be included in the inventive composition.

Illustrative, non-limiting, examples of such other resins include the following thermoplastic resins: polyolefin resins such as polyethylene (PE), polypropylene (PP), ethylene-vinyl acetate copolymers (EVA), and ethylene-ethyl acrylate copolymers (EEA); cyclic olefin resins; polystyrene resins such as polystyrene (PS), high-impact polystyrene (HIPS), acrylonitrile-styrene copolymers (AS), acrylonitrile-butadiene-styrene copolymers (ABS) and methyl methacrylate-styrene copolymers (MS); polycarbonate resins; vinyl chloride resins; polyamide resins; polyimide resins; (meth) acrylic resins such as polymethyl methacrylate (PMMA); polyester resins such as polyethylene terephthalate (PET), polybutylene terephthalate, polyethylene naphthalate, polybutylene naphthalate, polylactic acid (PLA), poly-3-hydroxybutyric acid, polycaprolactone, polybutylene succinate and polyethylene succinate/adipate; polyphenylene ether resins; modified polyphenylene ether resins; polyacetal resins; polysulfone resins; polyphenylene sulfide resins; polyvinyl alcohol resins; polyglycolic acid; modified starch; cellulose acetate and cellulose triacetate; chitin and chitosan; and lignin. Other exemplary resins include also thermoset resins such as phenolic resins, urea resins, melamine resins, unsaturated polyester resins, polyurethane resins and epoxy resins.

These resins may be used singly or two or more may be used in combination. The amount in which such resins are used per 100 parts by weight of the hyperbranched polymer is preferably from 1 to 10,000 parts by weight, and more preferably from 1 to 1,000 parts by weight.

For example, a composition with a (meth)acrylic resin may be obtained by including a (meth)acrylate compound in the composition and polymerizing the (meth)acrylate compound.

Illustrative examples of (meth)acrylate compounds include methyl (meth)acrylate, ethyl (meth)acrylate, ethylene glycol di(meth)acrylate, tetraethylene glycol di(meth)acrylate, polyethylene glycol di(meth)acrylate, propylene glycol di(meth)acrylate, polypropylene glycol di(meth)acrylate, 1,4-butanediol di(meth)acrylate, 1,6-hexanediol di(meth)acrylate, neopentylglycol di(meth)acrylate, trimethylolpropane trioxyethyl (meth)acrylate, tricyclodecane dimethanol di(meth)acrylate, tricyclodecanyl di(meth)acrylate, trimethylolpropane trioxypropyl (meth)acrylate, tris-2-hydroxyethyl isocyanurate tri(meth)acrylate, tris-2-hydroxyethyl isocyanurate di(meth)acrylate, 1,9-nonanediol di(meth)acrylate, pentaerythritol di(meth)acrylate, glycerol methacrylate acrylate, pentaerythritol tri(meth)acrylate, trimethylolpropane trimethacrylate, allyl (meth)acrylate, vinyl (meth)acrylate, epoxy (meth)acrylate, polyester (meth)acrylate and urethane (meth)acrylate.

The polymerization of these (meth)acrylate compounds may be carried out by light irradiation or heating in the presence of a photoradical initiator or a thermal radical initiator.

Examples of photoradical initiators include acetophenones, benzophenones, Michler's benzoyl benzoate, amyloxime ester, tetramethylthiuram monosulfide and thioxanthones.

Photocleavable photoradical initiators are especially preferred. Photocleavable photoradical initiators are listed on page 159 of *Saishin UV Kōka Gijutsu* [Recent UV Curing Technology] (publisher, K. Takausu; published by Gijutsu Joho Kyokai KK; 1991).

Examples of commercial photoradical initiators include those available from BASF under the trade names Irgacure 184, 369, 651, 500, 819, 907, 784 and 2959, the trade names CGI1700, CGI1750, CGI1850 and CG24-61, the trade names Darocur 1116 and 1173, and the trade name Lucirin TPO; that available from UCB under the trade name Ubecryl P36; and those available under the trade names Esacure KIP150, KIP65LT, KIP100F, KT37, KT55, KT046 and KIP75/B from the Fratelli Lamberti Company.

The photoradical initiator is used in the range of preferably from 0.1 to 15 parts by weight, and more preferably from 1 to 10 parts by weight, per 100 parts by weight of the (meth)acrylate compound.

The solvent used in polymerization is exemplified by the same solvents as those mentioned above for the film-forming composition.

EXAMPLES

The invention is illustrated more fully below by way of Working Examples of the invention and Comparative Examples, although the invention is not limited by these Examples. The instruments used for measurement in the examples were as follows.

$^1$H-NMR
  Instrument: JEOL-ECX300 (300 MHz)
  Solvent used in measurement: CHCl$_3$-d
  Reference material: Tetramethylsilane (TMS) (δ=0.0 ppm)
GPC
  Instrument: HLC-8320 GPC (Tosoh Corporation)
  Columns: Shodex KF-802.5+KF-803L
  Column temperature: 40° C.
  Solvent: 20 mM triethylamine-containing tetrahydrofuran
  Detector: UV (254 nm)
  Calibration curve: polystyrene standard
Ultraviolet-Visible Spectrophotometer
  Instrument: Shimadzu UV-3600 (Shimadzu Corporation)
Ellipsometer
  Instrument: VASE multiple incident angle spectroscopic ellipsometer (JA Woollam Japan)
Thermogravimetric/Differential Thermal Analyzer (TG-DTA)
  Instrument: TG-810 (Rigaku Corporation)
  Temperature ramp-up rate: 10° C./min
  Measurement temperatures: 25° C. to 750° C.
Light-Resistance Test
  Lamp: Low-pressure mercury lamp
  Illuminance: 20 mW/cm$^2$
Film Thickness Measurement
  Ellipsometer Example 1

Synthesis of Triazine Ring-Containing Hyperbranched Polymer [3]

[Chemical Formula 12]

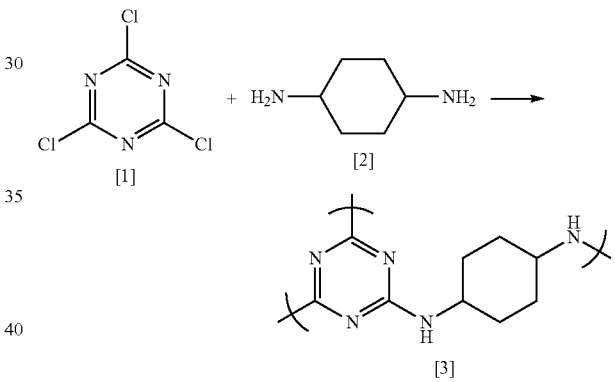

Under a nitrogen atmosphere, 40.66 g of 1,4-dioxane was poured into a 500 mL four-neck flask, then 3.01 g of 1,4-diaminocyclohexane (0.026 mol; Tokyo Chemical Industry Co., Ltd.) was added to the dioxane and dissolved therein. To this was added 5.49 g of sodium acetate (Tokyo Chemical Industry), and refluxing was carried out. Next, a solution of 3.59 g of 2,4,6-trichloro-1,3,5-triazine [1] (0.02 mol; Evonik Degussa) dissolved in 21.89 g of 1,4-dioxane was added thereto. After 5 minutes, 5.95 g of cyclohexylamine (0.06 mol; Tokyo Chemical Industry) was added dropwise. Following the completion of dropwise addition, the flask contents were stirred for 20 minutes, then 20 g of ion-exchanged water was added dropwise and stirring was continued for 1 hour. The reaction mixture was added dropwise to 392 g of ion-exchanged water to effect reprecipitation. The precipitate was collected by filtration, re-dissolved in 60 g of THF, and the solution was added dropwise to 500 g of ion-exchanged water to effect reprecipitation, after which the precipitate was collected by filtration. The solids thus obtained were dried in vacuo at 150° C. for 8 hours, yielding 5.69 g of the target hyperbranched polymer [3] (abbreviated below as "TC-495").

FIG. 1 shows the measured $^1$H-NMR spectrum for TC-495. The TC-495 thus obtained was a compound having structural units of formula (1). The polystyrene-equivalent weight-average molecular weight Mw of TC-495, as measured by GPC, was 900, and the polydispersity Mw/Mn was 2.00.

Measurement of Refractive Index and Transmittance

An amount of 0.1 g of the TC-495 obtained in Example 1 was dissolved in 0.9 g of cyclohexanone, giving a clear yellow solution. Using a spin coater, the resulting solution was spin-coated onto a glass substrate for 5 seconds at 100 rpm and for 30 seconds at 1,000 rpm, following which the solvent was removed by a 1-minute bake at 100° C. and a 5-minute bake at 300° C., thereby giving a film. The resulting film had a refractive index at 550 nm of 1.5917.

Figure 2:
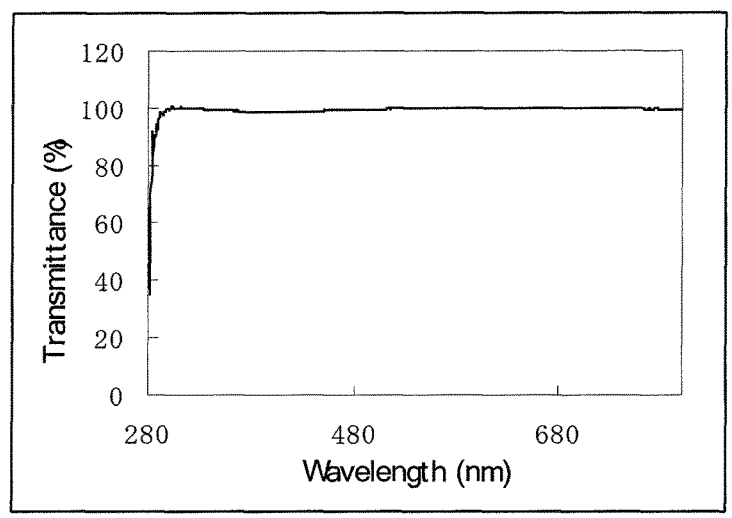
FIG. 2 is a plot showing the transmittance of the film produced in Example 1.

In addition, the transmittance of the resulting film to light at wavelengths of 400 to 800 nm was measured. The results are shown in FIG. 2.

Heat Resistance Test

Figure 3:
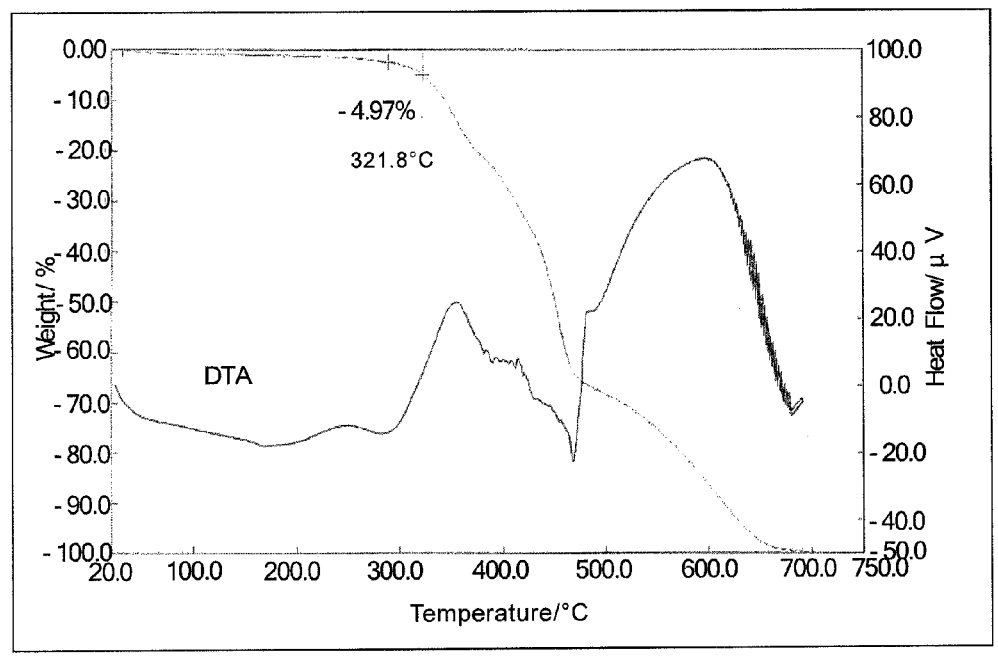
FIG. 3 shows the TG-DTA results for the hyperbranched polymer [3] obtained in Example 1.

An amount of 6.318 mg of the TC-495 obtained in Example 1 was added to a platinum pan, and measurement with a TG-DTA was carried out at a temperature ramp-up rate of 15° C./min, whereupon the 5% weight loss temperature was 322° C. Those results are shown in FIG. 3.

Example 2

Synthesis of Triazine Ring-Containing Hyperbranched Polymer [3]

Figure 4:
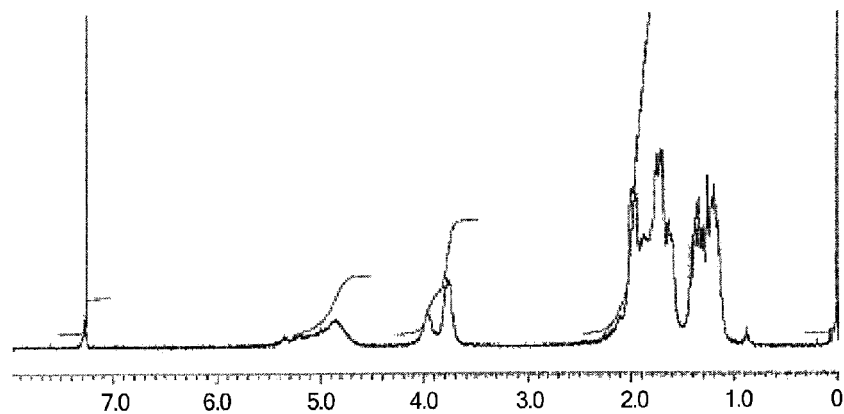
FIG. 4 is an $^1$H-NMR spectrum of the hyperbranched polymer [3] obtained in Example 2.

Under a nitrogen atmosphere, 20.08 g of 1,4-dioxane was poured into a 300 mL four-neck flask, then 3.71 g of 2,4,6-trichloro-1,3,5-triazine [1] (0.02 mol; Evonik Degussa) was added to the dioxane and dissolved therein. To this was added dropwise, at room temperature, a solution of 2.88 g of 1,4-diaminocyclohexane (0.025 mol; Tokyo Chemical Industry) and 2.01 g of cyclohexylamine (0.02 mol; Tokyo Chemical Industry) dissolved in 13.39 g of 1,4-dioxane. After 30 minutes, 27.38 g of 1,4-dioxane to which had been added 5.41 g of sodium acetate was added dropwise using a transfer tube and under refluxing, thereby commencing polymerization. After 2 hours, 3.97 g of cyclohexylamine (0.04 mol; Tokyo Chemical Industry) was added dropwise. Thirty minutes later, 50 g of ion-exchanged water was added dropwise, stopping polymerization. The reaction mixture was added dropwise to 392 g of ion-exchanged water to effect reprecipitation. The precipitate was collected by filtration, re-dissolved in 60 g of THF, and the solution was added dropwise to 500 g of ion-exchanged water to effect reprecipitation, after which the precipitate was collected by filtration. The solids thus obtained were dried in vacuo at 150° C. for 8 hours, yielding 4.44 g of the target hyperbranched polymer [3] (abbreviated below as "TC-491"). FIG. 4 shows the measured $^1$H-NMR spectrum for TC-491. The TC-491 thus obtained was a compound having structural units of formula (1). The polystyrene-equivalent weight-average molecular weight Mw of TC-491, as measured by GPC, was 600, and the polydispersity Mw/Mn was 2.52.

Heat Resistance Test

Figure 5:
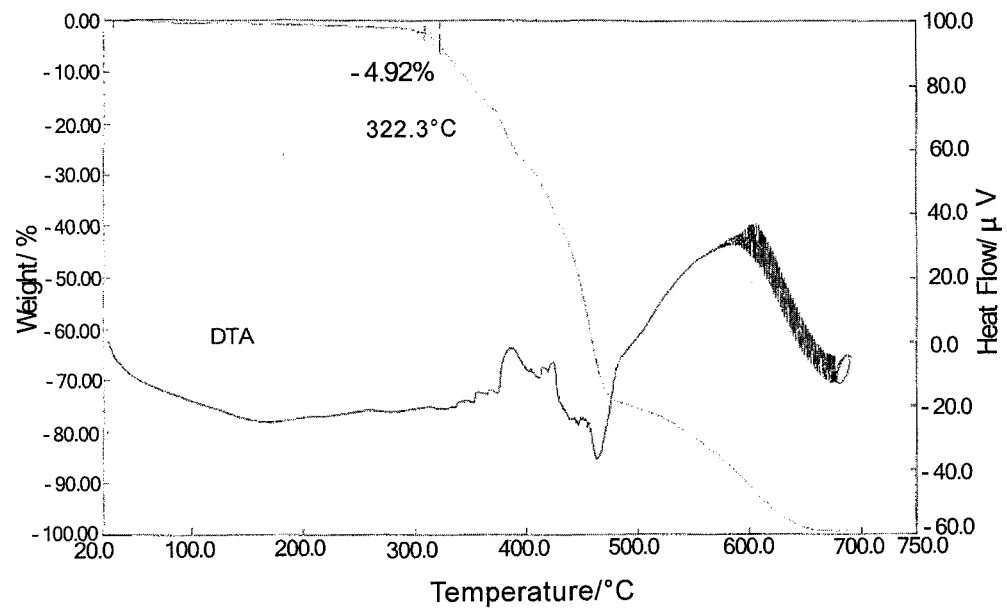
FIG. 5 shows the TG-DTA results for the hyperbranched polymer [3] obtained in Example 2.

TG-DTA measurement for the TC-491 obtained in Example 2 was carried out by the same method as in Example 1, whereupon the 5% weight loss temperature was 322° C. The results are shown in FIG. 5.

Example 3

Synthesis of Triazine Ring-Containing Hyperbranched Polymer [3]

Under a nitrogen atmosphere, 40.66 g of 1,4-dioxane was poured into a 300 mL four-neck flask, then 2.88 g of 1,4-diaminocyclohexane (0.025 mol; Tokyo Chemical Industry) and 5.41 g of sodium acetate (0.066 mol; Tokyo Chemical Industry) were added and refluxing was carried out. To this was added dropwise a solution of 3.70 g of 2,4,6-trichloro-1,3,5-triazine [1] (0.02 mol; Evonik Degussa) dissolved in 21.89 g of 1,4-dioxane, after which 20 g of ion-exchanged water was added dropwise, thereby commencing polymerization. After 1 hour, 5.99 g of cyclohexylamine (0.06 mol; Tokyo Chemical Industry) was added dropwise, and polymerization was stopped after another 60 minutes. The reaction mixture was added dropwise to 400 g of ion-exchanged water to effect reprecipitation. The precipitate was collected by filtration, re-dissolved in 60 g of THF, and the solution was added to 500 g of ion-exchanged water to effect reprecipitation, after which the precipitate was collected by filtration. The solids thus obtained were dried in vacuo at 150° C. for 8 hours, yielding 5.15 g of the target hyperbranched polymer [3] (abbreviated below as "TC-496"). The TC-496 thus obtained was a compound having structural units of formula (1). The polystyrene-equivalent weight-average molecular weight Mw of TC-496, as measured by GPC, was 3,000, and the polydispersity Mw/Mn was 3.18.

Heat Resistance Test

Figure 6:
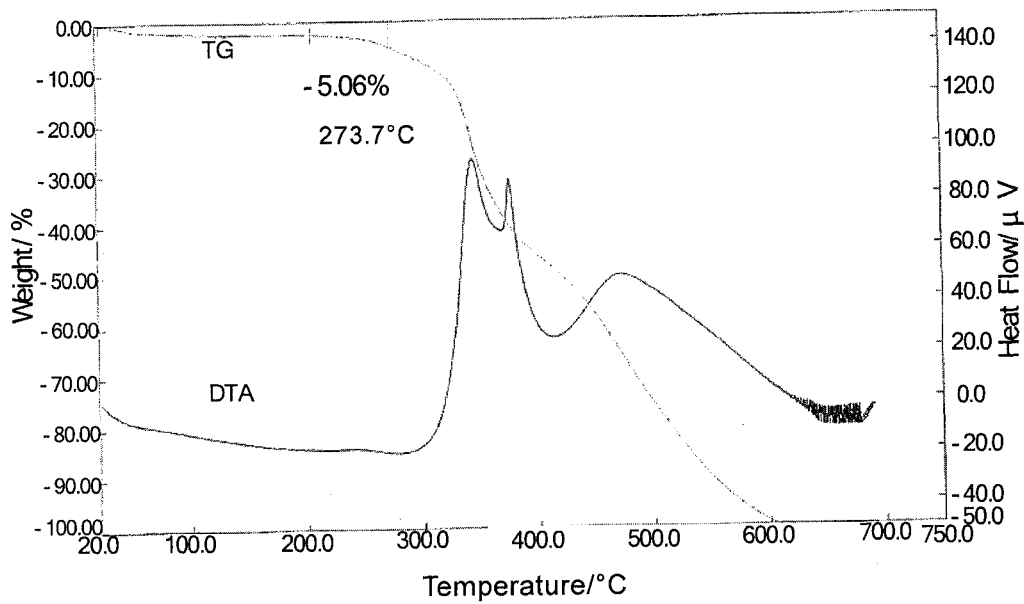
FIG. 6 shows the TG-DTA results for the hyperbranched polymer [3] obtained in Example 3.

TG-DTA measurement for the TC-496 obtained in Example 3 was carried out by the same method as in Example 1, whereupon the 5% weight loss temperature was 273° C. The results are shown in FIG. 6.

Example 4

Synthesis of Triazine Ring-Containing Hyperbranched Polymer [5]

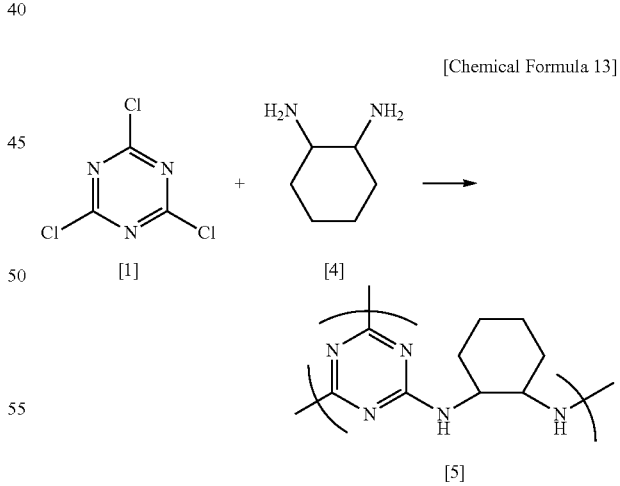

[Chemical Formula 13]

Figure 7:
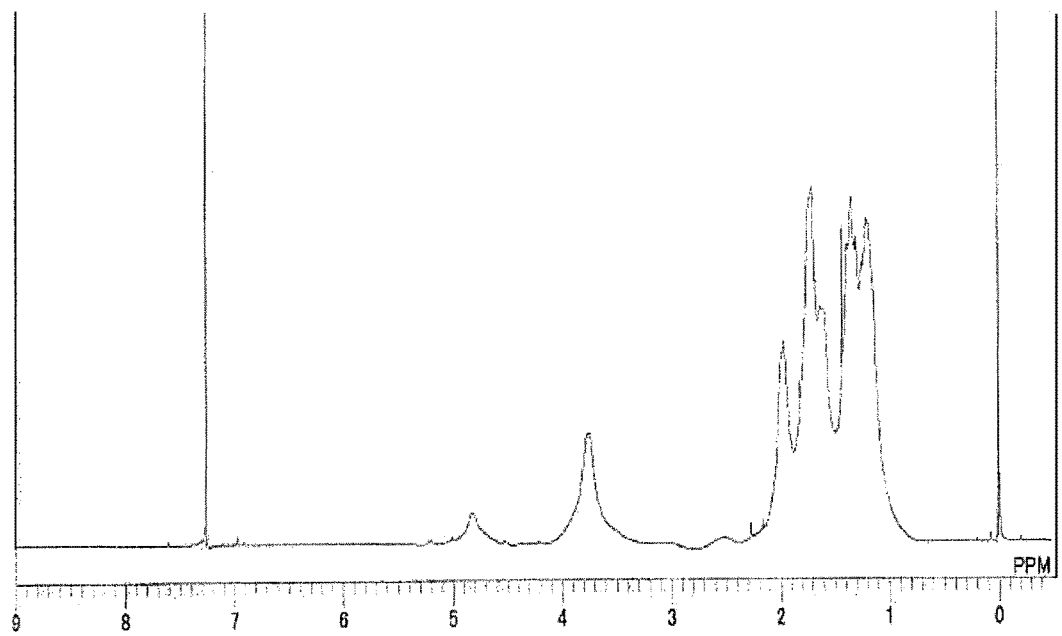
FIG. 7 is an $^1$H-NMR spectrum of the hyperbranched polymer [5] obtained in Example 4.

Under a nitrogen atmosphere, 40.88 g of 1,4-dioxane, 2.86 g of 1,2-diaminocyclohexane (0.025 mol; Tokyo Chemical Industry), 1.98 g of cyclohexylamine (0.02 mol; Tokyo Chemical Industry) and 5.44 g of sodium acetate were added to a 300 mL four-neck flask and stirred. To this was added dropwise a solution of 3.75 g of 2,4,6-trichloro-1,3,5-triazine [1] (0.02 mol; Evonik Degussa) dissolved in 22.14 g of 1,4-dioxane, thereby commencing polymerization. After 2 hours, 4.00 g of cyclohexylamine (0.06 mol; Tokyo Chemical Industry) was added dropwise. Thirty minutes later, 20 g of ion-exchanged water was added dropwise, then the flask contents were stirred for 1 hour and polymerization was stopped. Purification was carried out as in Example 1, yielding 2.10 g of the target hyperbranched polymer [5] (abbreviated below as "TC-243"). FIG. 7 shows the measured $^1$H-NMR spectrum for TC-243. The TC-243 thus obtained was a compound having structural units of formula (1). The polystyrene-equivalent weight-average molecular weight Mw of TC-243, as measured by GPC, was 1,000, and the polydispersity Mw/Mn was 4.42.

Measurement of Refractive Index and Transmittance

An amount of 0.1 g of the TC-243 obtained above was dissolved in 0.9 g of cyclohexanone, giving a clear yellow solution. Using a spin coater, the resulting solution was spin-coated onto a glass substrate for 5 seconds at 100 rpm and for 30 seconds at 1,000 rpm, following which the solvent was removed by a 5-minute bake at 300° C., thereby giving a film. The resulting film had a refractive index at 550 nm of 1.5820.

Figure 8:
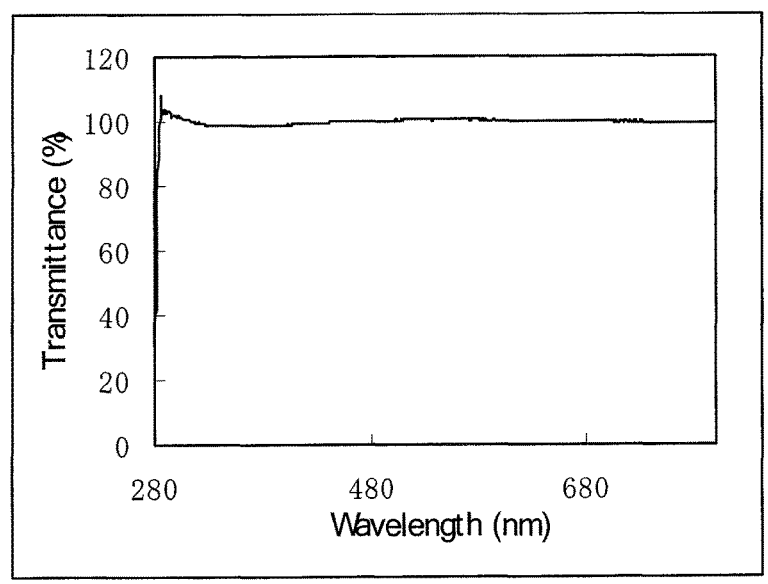
FIG. 8 is a plot showing the transmittance of the film produced in Example 4.

In addition, the transmittance of the resulting film to light at wavelengths of 400 to 800 nm was measured. The results are shown in FIG. 8.

Heat Resistance Test

Figure 9:
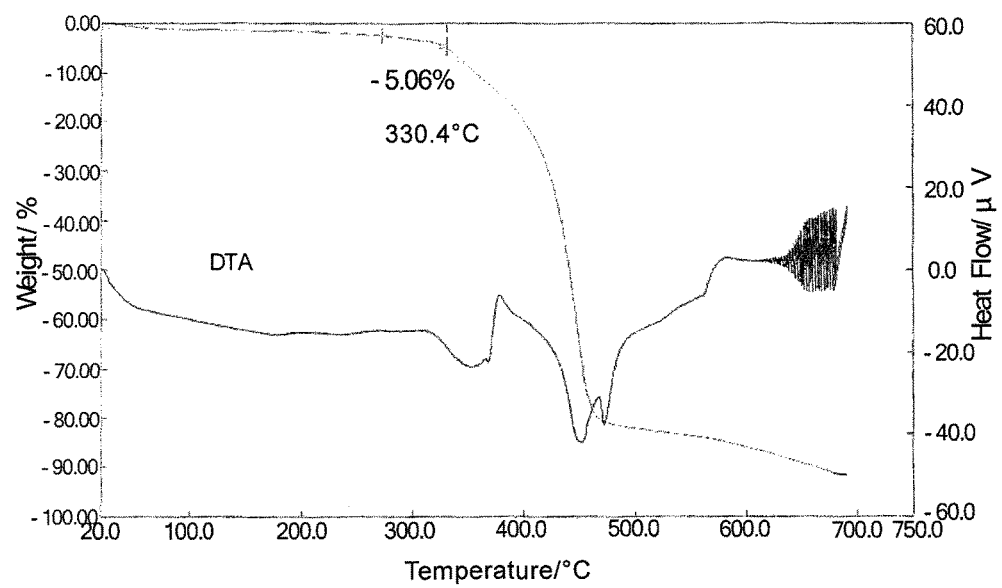
FIG. 9 shows the TG-DTA results for the hyperbranched polymer [5] obtained in Example 4.

TG-DTA measurement for the TC-243 obtained above was carried out by the same method as in Example 1, whereupon the 5% weight loss temperature was 330° C. The results are shown in FIG. 9.

Example 5

Synthesis of Triazine Ring-Containing Hyperbranched Polymer [3]

Figure 10:
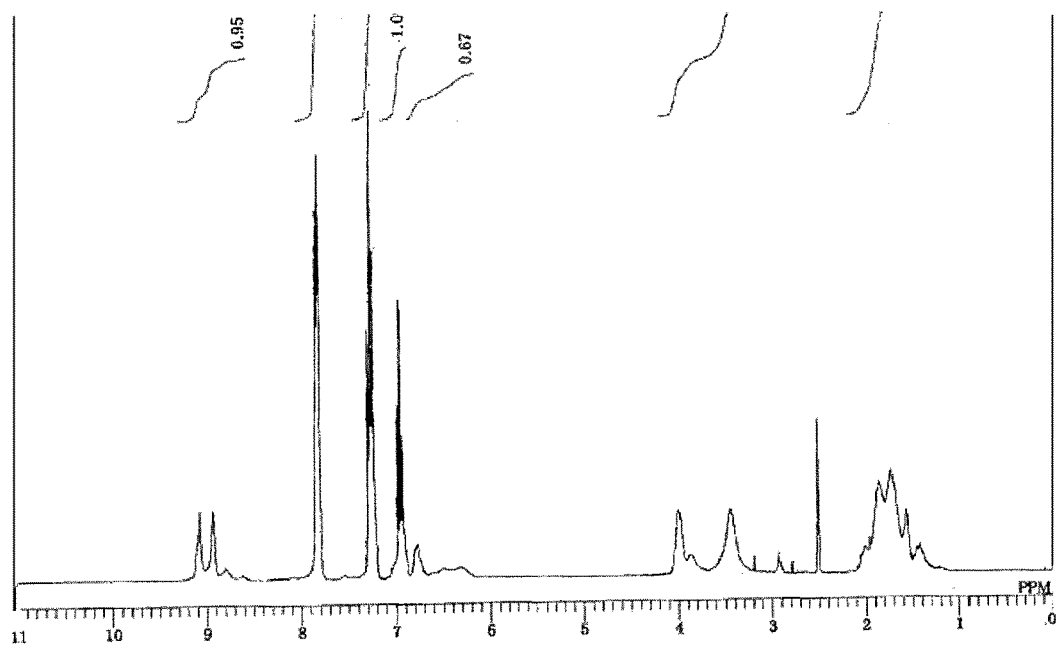
FIG. 10 is an $^1$H-NMR spectrum of the hyperbranched polymer [3] obtained in Example 5.

Under a nitrogen atmosphere, 1.52 g of 1,4-diaminocyclohexane [2] (0.013 mol; Tokyo Chemical Industry) and 40 mL of dimethylacetamide were poured into a 100 mL four-neck flask, following which 1.86 g of 2,4,6-trichloro-1,3,5-triazine [1] (0.01 mol; Tokyo Chemical Industry) dissolved in 10 mL of dimethylacetamide was added and polymerization was carried out. After 5 minutes, 2.80 g of aniline (0.03 mol; Junsei Chemical Co., Ltd.) was added, stirring was carried out for 50 minutes and polymerization was stopped. Purification was carried out by the same procedure as in Example 1, yielding 0.87 g of the target hyperbranched polymer [3] (abbreviated below as "TC-418"). FIG. 10 shows the measured $^1$H-NMR spectrum for TC-418. The TC-418 thus obtained was a compound having structural units of formula (1). The polystyrene-equivalent weight-average molecular weight Mw of TC-418, as measured by GPC, was 600, and the polydispersity Mw/Mn was 1.11.

Measurement of Refractive Index and Transmittance

An amount of 0.1 g of the TC-418 obtained above was dissolved in 0.9 g of cyclohexanone, giving a clear yellow solution. Using a spin coater, the resulting solution was spin-coated onto a glass substrate for 5 seconds at 100 rpm and for 30 seconds at 1,000 rpm, following which the solvent was removed by a 5-minute bake at 150° C., thereby giving a film. The resulting film had a refractive index at 550 nm of 1.7050.

Figure 11:
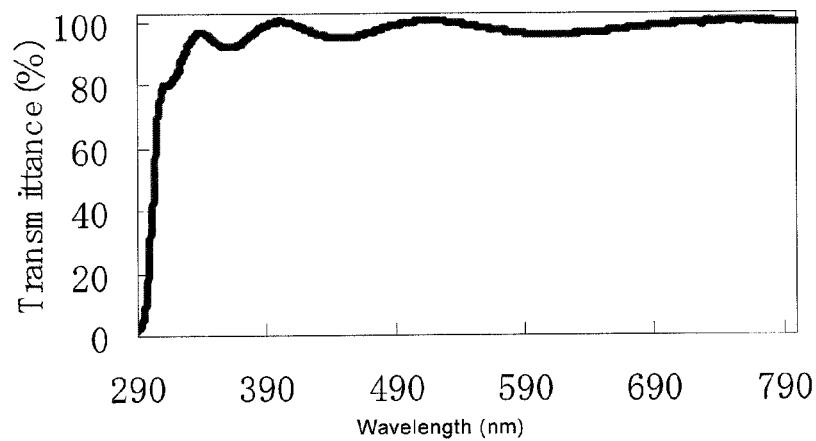
FIG. 11 is a plot showing the transmittance of the film produced in Example 5.

In addition, the transmittance of the resulting film to light at wavelengths of 400 to 800 nm was measured. The results are shown in FIG. 11.

Heat Resistance Test

Figure 12:
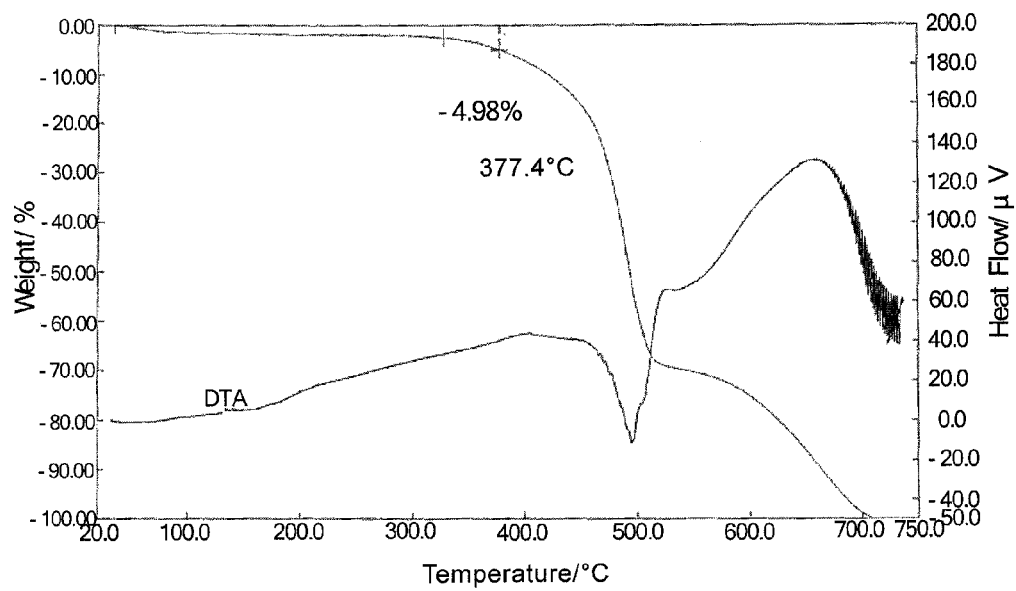
FIG. 12 shows the TG-DTA results for the hyperbranched polymer [3] obtained in Example 5.

TG-DTA measurement for the TC-418 obtained above was carried out by the same method as in Example 1, whereupon the 5% weight loss temperature was 377° C. The results are shown in FIG. 12.

Example 6

Synthesis of Triazine Ring-Containing Hyperbranched Polymer [5]

Figure 13:
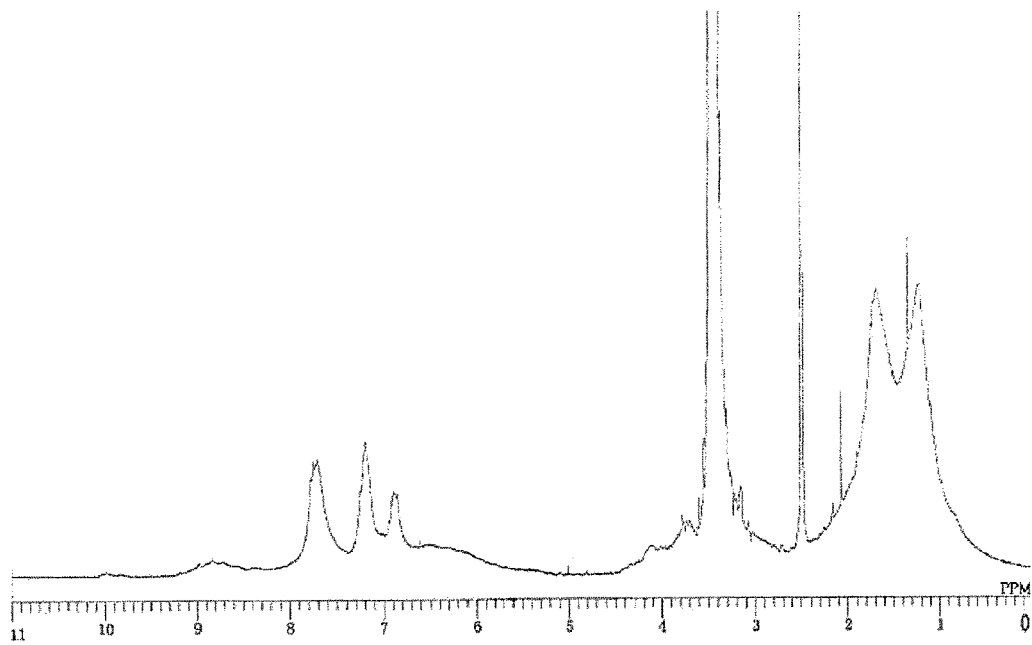
FIG. 13 is an $^1$H-NMR spectrum of the hyperbranched polymer [5] obtained in Example 6.

Under a nitrogen atmosphere, 3.04 g of 1,2-diaminocyclohexane [4] (0.026 mol; Tokyo Chemical Industry), 1.14 g of aniline (0.012 mol; Junsei Chemical Co., Ltd.), and 40.77 g of 1,4-dioxane were poured into a 300 mL four-neck flask, following which 3.74 g of 2,4,6-trichloro-1,3,5-triazine [1] (0.02 mol; Evonik Degussa) dissolved in 22.14 g of 1,4-dioxane was added dropwise under refluxing. Next, 5.41 g of sodium acetate dissolved in 20 g of ion-exchanged water was added dropwise, and polymerization was carried out. After 1 hour, 4.80 g of cyclohexylamine (0.048 mol; Tokyo Chemical Industry) was added dropwise, stirring was carried out for 1 hour, and polymerization was stopped. Purification was carried out by the same procedure as in Example 1, yielding 2.67 g of the target hyperbranched polymer [5] (abbreviated below as "TC-245"). FIG. 13 shows the measured $^1$H-NMR spectrum for TC-245. The TC-245 thus obtained was a compound having structural units of formula (1). The polystyrene-equivalent weight-average molecular weight Mw of TC-425, as measured by GPC, was 1,600, and the polydispersity Mw/Mn was 3.56.

Measurement of Refractive Index

An amount of 0.1 g of the TC-245 obtained above was dissolved in 0.9 g of cyclohexanone, giving a clear yellow solution. Using a spin coater, the resulting solution was spin-coated onto a glass substrate for 5 seconds at 100 rpm and for 30 seconds at 1,000 rpm, following which the solvent was removed by a 1-minute bake at 100° C. and a 5-minute at 300° C., thereby giving a film. The resulting film had a refractive index at 550 nm of 1.6200.

Heat Resistance Test

Figure 14:
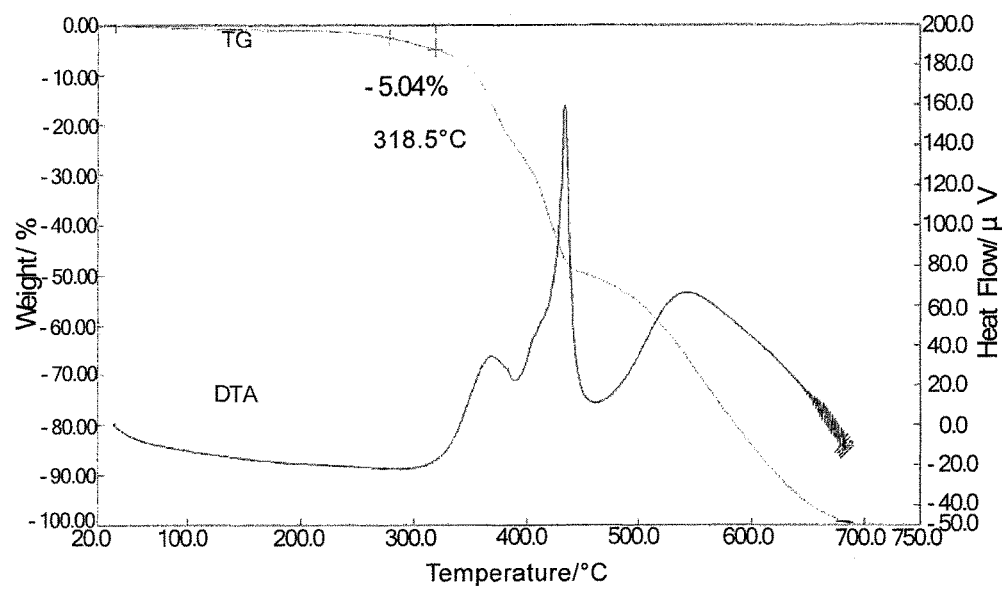
FIG. 14 shows the TG-DTA measurement results for the hyperbranched polymer [5] obtained in Example 6.

TG-DTA measurement for the TC-245 obtained above was carried out by the same method as in Example 1, whereupon the 5% weight loss temperature was 318° C. The results are shown in FIG. 14.

Example 7

Synthesis of Triazine Ring-Containing Hyperbranched Polymer [5]

Figure 15:
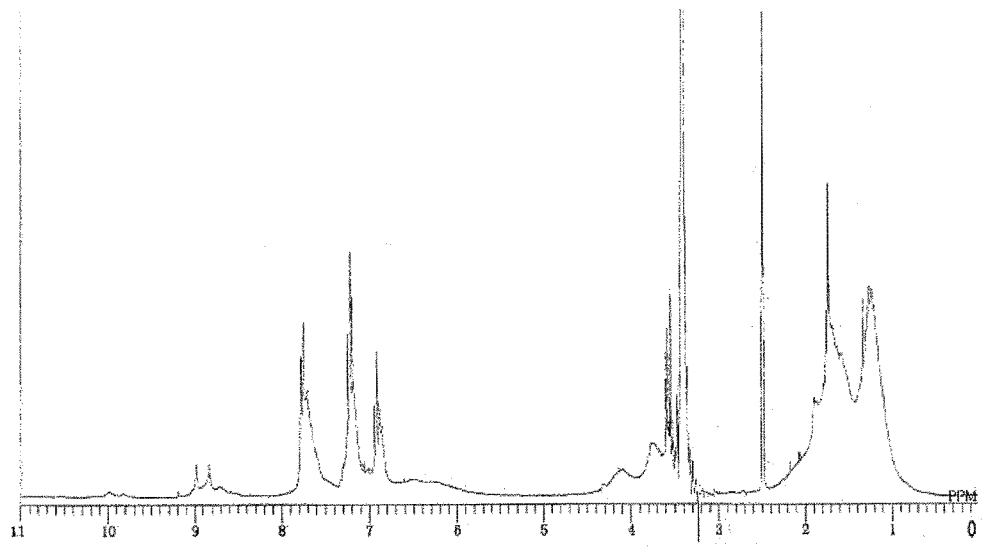
FIG. 15 is an $^1$H-NMR spectrum of the hyperbranched polymer [5] obtained in Example 7.

Using 2.32 g of 1,2-diaminocyclohexane (0.02 mol; Tokyo Chemical Industry), 1.14 g of aniline (0.012 mol; Junsei Chemical), 3.74 g of 2,4,6-trichloro-1,3,5-triazine [1] (0.02 mol; Evonik Degussa) and 4.80 g of cyclohexylamine (0.048 mol; Tokyo Chemical Industry), polymerization was carried out by the same procedure as in Example 6, yielding 4.42 g of the target hyperbranched polymer [5] (abbreviated below as "TC-247"). FIG. 15 shows the measured $^1$H-NMR spectrum for TC-247. The TC-247 thus obtained was a compound having structural units of formula (1). The polystyrene-equivalent weight-average molecular weight Mw of TC-247, as measured by GPC, was 1,500, and the polydispersity Mw/Mn was 2.99.

Measurement of Refractive Index

Figure 16:
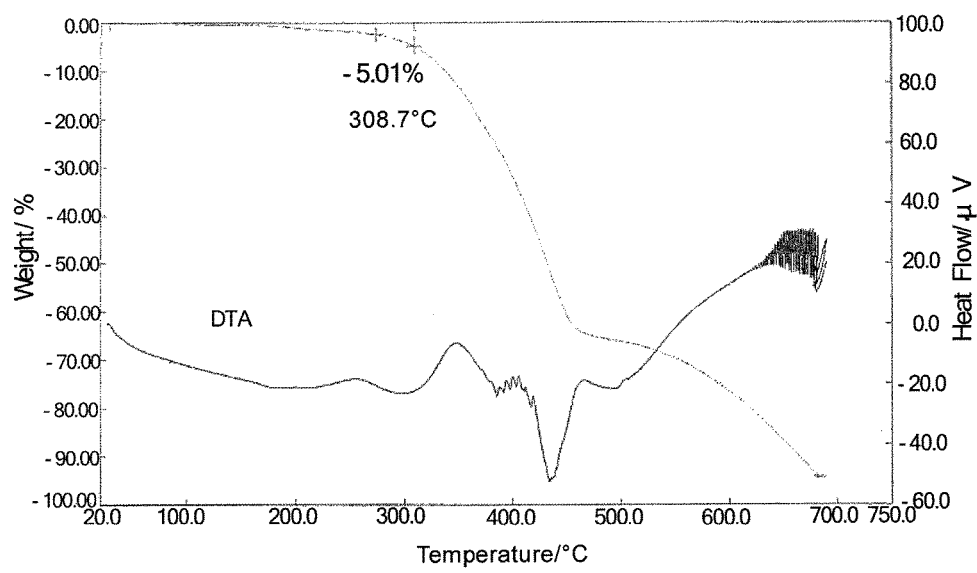
FIG. 16 shows the TG-DTA results for the hyperbranched polymer [5] obtained in Example 7.

An amount of 0.1 g of the TC-247 obtained above was dissolved in 0.9 g of cyclohexanone, giving a clear yellow solution. Using a spin coater, the resulting solution was spin-coated onto a glass substrate for 5 seconds at 100 rpm and for 30 seconds at 1,000 rpm, following which the solvent was removed by a 1-minute bake at 100° C. and a 5-minute bake at 300° C., thereby giving a film. The resulting film had a refractive index at 550 nm of 1.6264.
Heat Resistance Test TG-DTA measurement for the TC-247 obtained above was carried out by the same method as in Example 1, whereupon the 5% weight loss temperature was 308° C. The results are shown in FIG. 16.

Example 8

Synthesis of Triazine Ring-Containing Hyperbranched Polymer [5]

Figure 17:
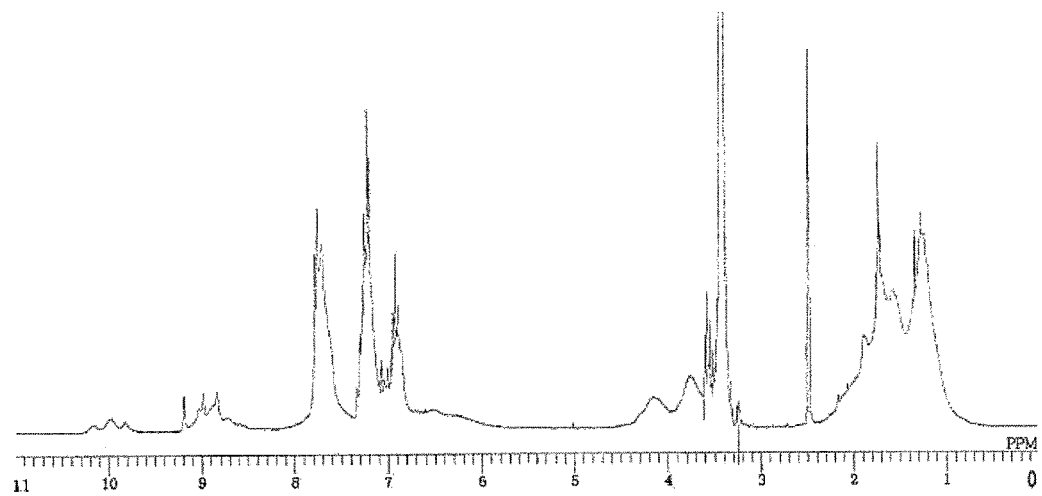
FIG. 17 is an $^1$H-NMR spectrum of the hyperbranched polymer [5] obtained in Example 8.
Figure 18:
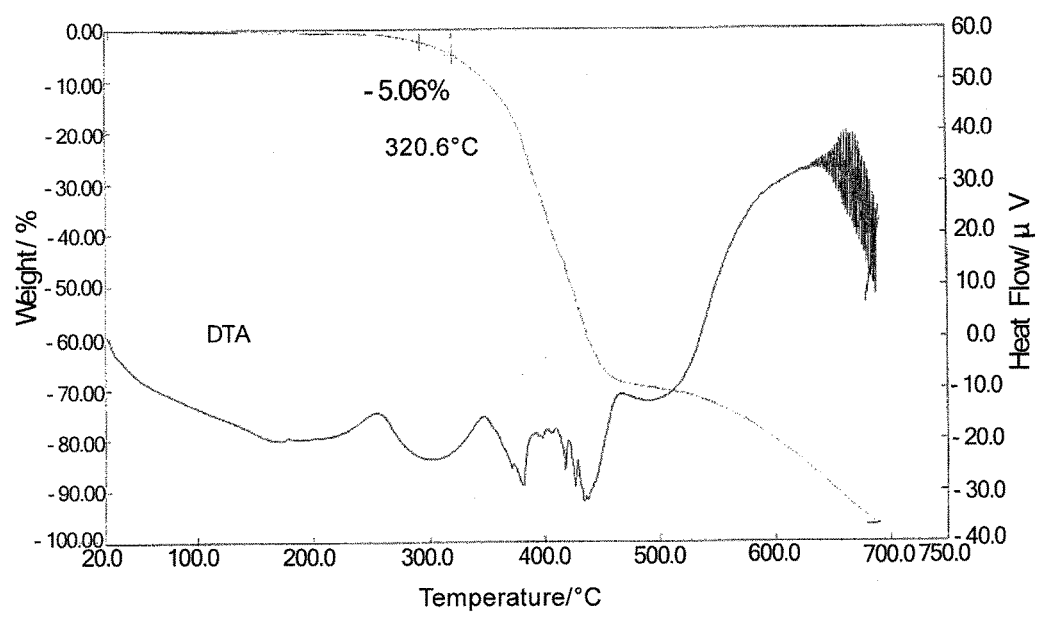
FIG. 18 shows the TG-DTA results for the hyperbranched polymer [5] obtained in Example 8.

Using 2.31 g of 1,2-diaminocyclohexane (0.02 mol; Tokyo Chemical Industry), 1.71 g of aniline (0.018 mol; Junsei Chemical), 3.74 g of 2,4,6-trichloro-1,3,5-triazine [1] (0.02 mol; Evonik Degussa) and 4.22 g of cyclohexylamine (0.042 mol; Tokyo Chemical Industry), polymerization was carried out by the same procedure as in Example 6, yielding 4.72 g of the target hyperbranched polymer [5] (abbreviated below as "TC-248"). FIG. 17 shows the measured $^1$H-NMR spectrum for TC-248. The TC-248 thus obtained was a compound having structural units of formula (1). The polystyrene-equivalent weight-average molecular weight Mw of TC-248, as measured by GPC, was 1,100, and the polydispersity Mw/Mn was 2.12.
Measurement of Refractive Index An amount of 0.1 g of the TC-248 obtained above was dissolved in 0.9 g of cyclohexanone, giving a clear yellow solution. Using a spin coater, the resulting solution was spin-coated onto a glass substrate for 5 seconds at 100 rpm and for 30 seconds at 1,000 rpm, following which the solvent was removed by a 1-minute bake at 100° C. and a 5-minute bake at 300° C., thereby giving a film. The resulting film had a refractive index at 550 nm of 1.6481.
Heat Resistance Test TG-DTA measurement for the TC-248 obtained above was carried out by the same method as in Example 1, whereupon the 5% weight loss temperature was 320° C. The results are shown in FIG. 18.

Example 9

Light Resistance Test

Using a spin coater, 10 wt % cyclohexanone solutions of each of the hyperbranched polymers prepared in Examples 1, 4, and 6 to 8 were spin-coated for 5 seconds at 100 rpm and for 30 seconds at 1500 rpm onto respective glass substrates measuring 5 cm×5 cm, following which the solvent was removed by a 1-minute bake at 100° C. and a 5-minute bake at 250° C., thereby giving a film in each case. In addition, a 5% cyclohexanone solution of PMMA (Aldrich) as Comparative Example 1 and a 5 wt % cyclohexanone solution of ARTON (grade: D4531F; JSR Corporation) as Comparative Example 2 were spin-coated for 5 seconds at 100 rpm and for 30 seconds at 1,500 rpm onto respective glass substrates measuring 5 cm×5 cm, following which the solvent was removed by a 1-minute bake at 100° C. and a 5-minute bake at 250° C., thereby giving a film in each case.

The film-coated substrates were each divided into four pieces, the divided substrates were subjected to 5J, 10J and 75J of light irradiation, and evaluations of the refractive indices and film thicknesses before and after irradiation were carried out. The results are shown in Table 1.

TABLE 1

| | Energy (J) | Refractive index (550 nm) | Film thickness (nm) |
|---|---|---|---|
| Example 1 | 0 | 1.5917 | 278 |
| | 5 | — | — |
| | 10 | 1.5992 | 282 |
| | 75 | 1.6222 | 257 |
| Example 4 | 0 | 1.5820 | 174 |
| | 5 | 1.5903 | 176 |
| | 10 | 1.5862 | 179 |
| | 75 | 1.5960 | 163 |
| Example 6 | 0 | 1.6200 | 143 |
| | 5 | 1.6241 | 148 |
| | 10 | 1.6180 | 148 |
| | 75 | 1.6030 | 120 |
| Example 7 | 0 | 1.6264 | 296 |
| | 5 | 1.6327 | 300 |
| | 10 | 1.6327 | 300 |
| | 75 | 1.6307 | 291 |
| Example 8 | 0 | 1.6481 | 266 |
| | 5 | 1.6488 | 272 |
| | 10 | 1.6489 | 269 |
| | 75 | 1.6472 | 259 |
| Comparative Example 1 | 0 | 1.4927 | 367 |
| | 5 | 1.4970 | 339 |
| | 10 | 1.4997 | 322 |
| | 75 | 1.4927 | 187 |
| Comparative Example 2 | 0 | 1.5192 | 337 |
| | 5 | 1.5602 | 152 |
| | 10 | 1.5456 | 178 |
| | 75 | 1.5485 | 179 |

As shown in Table 1, marked changes in the refractive index and film thickness following light irradiation were not observed in the hyperbranched polymers obtained in Examples 1, 4 and 6 to 8.

By contrast, in the case of the PMMA and ARTON used in Comparative Examples 1 and 2, decreases in film thickness of about 100 nm were observed.

These results demonstrated that triazine ring-containing hyperbranched polymers had a good light resistance, regardless of the presence or absence of terminal phenyl groups.

Example 10

Refractive Index Modification and Heat Curing Test

The hyperbranched polymer obtained in Example 8 (TC-248) was added in amounts of 10, 30, 50 and 70 wt % relative to the crosslinking agent dipentaerythritol hexaacrylate (Nippon Kayaku Co., Ltd.), and cyclohexane solutions having a solids content of 10 wt % were prepared. The solutions were spin-coated onto respective glass substrates for 5 seconds at 200 rpm and for 30 seconds at 1,500 rpm. The solvent was then removed by a 1-minute bake at 100° C. and a 5-minute bake at 250° C. The refractive indices and film thicknesses of the films thus obtained were measured. The results are shown in Table 2.

In addition, these films were immersed in cyclohexanone, then spray-dried 5 minutes later, after which measurements of the refractive index and film thickness were carried out in the same way as described above. These results as well are shown in Table 2.

TABLE 2

| Amount of HPB added (wt %) | Refractive index (550 nm) | Film thickness (nm) | Refractive index after immersion (550 nm) | Film thickness after immersion (nm) |
|---|---|---|---|---|
| 10 | 1.5321 | 264 | 1.5331 | 269 |
| 30 | 1.5558 | 242 | 1.5588 | 237 |
| 50 | 1.5938 | 215 | 1.5935 | 218 |
| 70 | 1.6156 | 240 | 1.6174 | 242 |

Example 11

Refractive Index Modification and Heat Curing Test

Aside from using Takenate B882N (Mitsui Chemicals, Inc.) as the crosslinking agent, films were produced in the same way as in Example 10. The refractive indices and film thicknesses before and after immersion in cyclohexanone were measured for the resulting films. The results are shown in Table 3.

TABLE 3

| Amount of HPB added (wt %) | Refractive index (550 nm) | Film thickness (nm) | Refractive index after immersion (550 nm) | Film thickness after immersion (nm) |
|---|---|---|---|---|
| 10 | 1.5760 | 71 | 1.5748 | 73 |
| 30 | 1.6170 | 102 | 1.6165 | 102 |
| 50 | 1.6356 | 144 | 1.6344 | 145 |
| 70 | 1.6468 | 196 | 1.6420 | 193 |

As shown in Tables 2 and 3, because marked changes in the refractive indices and film thicknesses were not observed after heat curing, it is apparent that thermoset compositions were obtained. Also, because the refractive index increased as the amount of hyperbranched polymer addition rises, the hyperbranched polymer of the invention was found to serve as a refractive index modifier.

Example 12

Synthesis of Triazine Ring-Containing Hyperbranched Polymer [7]

[Chemical Formula 14]

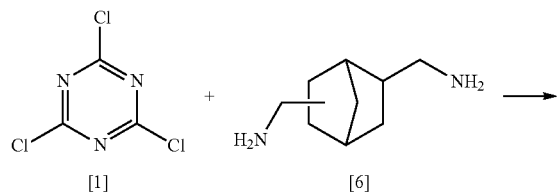

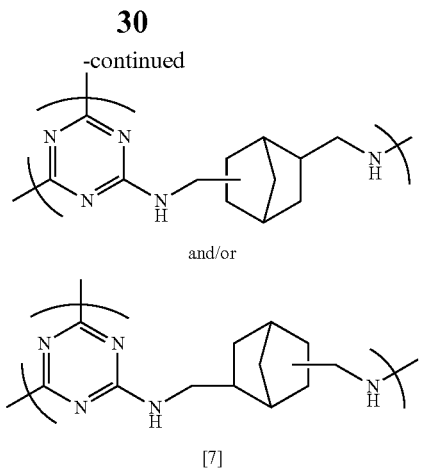

[7]

Under a nitrogen atmosphere, 257.09 g of 1,4-dioxane, 18.68 g of norbornanediamine [6] (0.162 mol; Mitsui Fine Chemicals, Inc.) and 6.11 g of cyclohexylamine (0.065 mol; Tokyo Chemical Industry) were added to a 1,000 mL four-neck flask, followed by stirring and refluxing. To this was added dropwise a solution of 24.20 g of 2,4,6-trichloro-1,3,5-triazine [1] (0.13 mol; Evonik Degussa) dissolved in 138.43 g of 1,4-dioxane, after which the flask contents were stirred for 10 minutes. A solution of 35.19 g of sodium acetate (0.429 mol; Junsei Chemical Co., Ltd.) dissolved in 124 g of ion-exchanged water was added dropwise, thereby starting polymerization. After 1 hour, 32.2 g of cyclohexylamine (0.325 mol; Tokyo Chemical Industry) was added dropwise; after another 60 minutes, stirring was stopped. Purification was carried out in the same way as in Example 1, yielding 23.19 g of the target polymeric compound [7] (abbreviated below as "T-NB").

The T-NB thus obtained was a compound having structural units of formula (1). The polystyrene-equivalent weight-average molecular weight Mw of T-NB, as measured by GPC, was 1,800, and the polydispersity Mw/Mn was 3.60.

Because T-NB does not dissolve in deuterated chloroform or deuterated DMSO, the $^1$H-NMR spectra could not be measured.

Measurement of Refractive Index and Transmittance

An amount of 0.5 g of the T-NBO obtained was dissolved in 4.5 g of cyclohexanone, giving a clear colorless solution. Using a spin coater, the resulting solution was spin-coated onto a glass substrate for 5 seconds at 200 rpm and for 30 seconds at 1,500 rpm, following which the solvent was removed by a 5-minute bake at 250° C., thereby giving a film. The resulting film had a refractive index at 550 nm of 1.6082.

Figure 19:
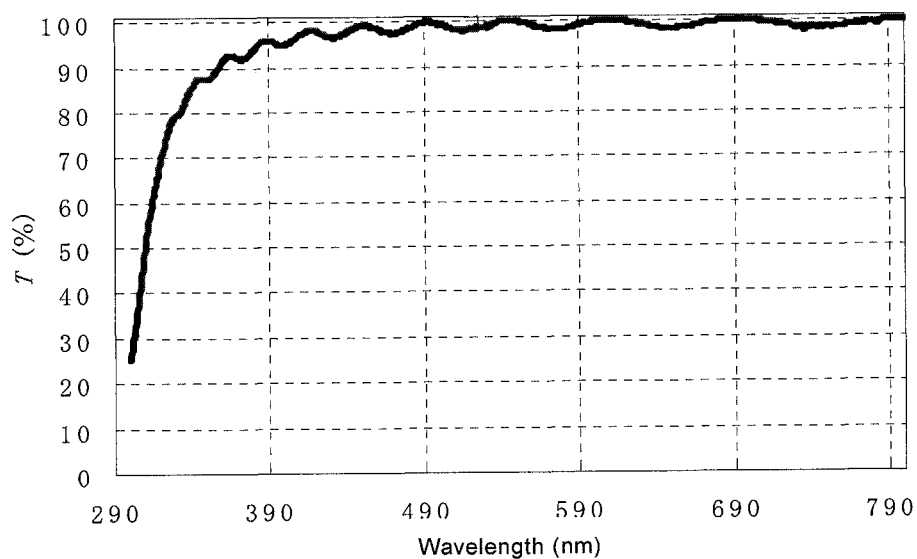
FIG. 19 is a plot showing the transmittance of the film produced in Example 12.

In addition, the transmittance of the resulting film to light at wavelengths of 400 to 800 nm was measured. The results are shown in FIG. 19.

Heat Resistance Test

Figure 20:
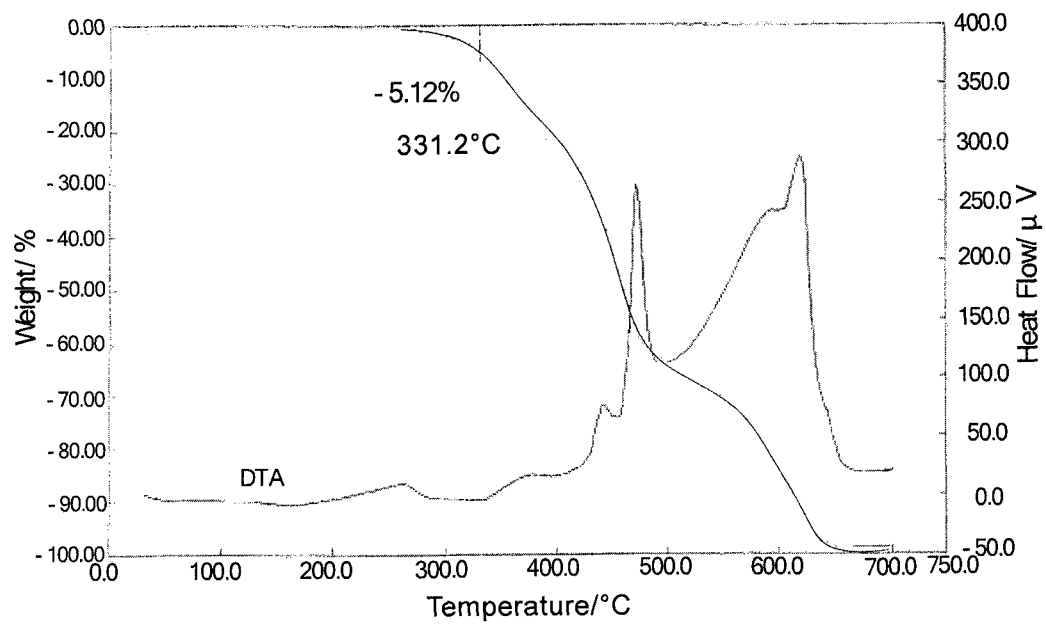
FIG. 20 shows the TG-DTA results for the hyperbranched polymer [7] obtained in Example 12.

TG-DTA measurement for the T-NB obtained above was carried out by the same method as in Example 1, whereupon the 5% weight loss temperature was 331° C. The results are shown in FIG. 20.

Example 13

Synthesis of Triazine Ring-Containing Hyperbranched Polymer [5] by Low-Temperature Reaction and Simultaneous Aniline Addition

[Chemical Formula 15]

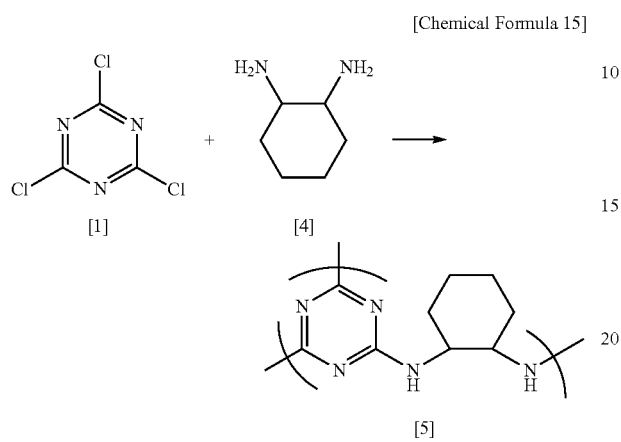

Under a nitrogen atmosphere, 37.91 g of 1,4-dioxane, 25.30 g of tetrahydrofuran, 6.39 g of 1,2-diaminocyclohexane (0.056 mol; Tokyo Chemical Industry) and 5.22 g of aniline (0.056 mol) were added to a 100 mL four-neck flask, then cooled to −10° C. in an acetone-dry ice bath. To this was added stepwise, over a period of 100 minutes, a solution of 7.38 g of 2,4,6-trichloro-1,3,5-triaziine [1] (0.04 mol; Evonik Degussa) dissolved in 23.38 g of 1,4-dioxane. Next, after 60 minutes of stirring at room temperature, the system was again cooled to from −5 to 0° C., and a solution of 3.61 g of sodium acetate in 10.71 g of water was slowly added dropwise. After 60 minutes of stirring, this reaction mixture was added dropwise, over a period of 30 minutes, to a 200 mL four-neck flask to which had already been added 37.91 g of 1,4-dioxane, 7.22 g of sodium acetate and 21.43 g of water and which was heated to 85° C. Following dropwise addition, stirring was carried out for 60 minutes, thereby effecting polymerization. Next, 6.35 g of cyclohexylamine (0.064 mol; Tokyo Chemical Industry) was added dropwise, stirring was carried out for 60 minutes, and polymerization was stopped.

The reaction mixture was cooled to 40° C., following which the aqueous phase was removed by letting the system stand at rest, then carrying out liquid/liquid separation. Next, 24.29 g of 28% ammonia water was added to the recovered organic phase, following which the system was stirred then left at rest, and the organic phase was subsequently collected by liquid/liquid separation. The organic phase was added dropwise to 516 g of ion-exchanged water to effect reprecipitation, after which filtration was carried out, yielding 8.25 g of the target polymeric compound [5] (abbreviated below as "T-250-2").

Figure 21:
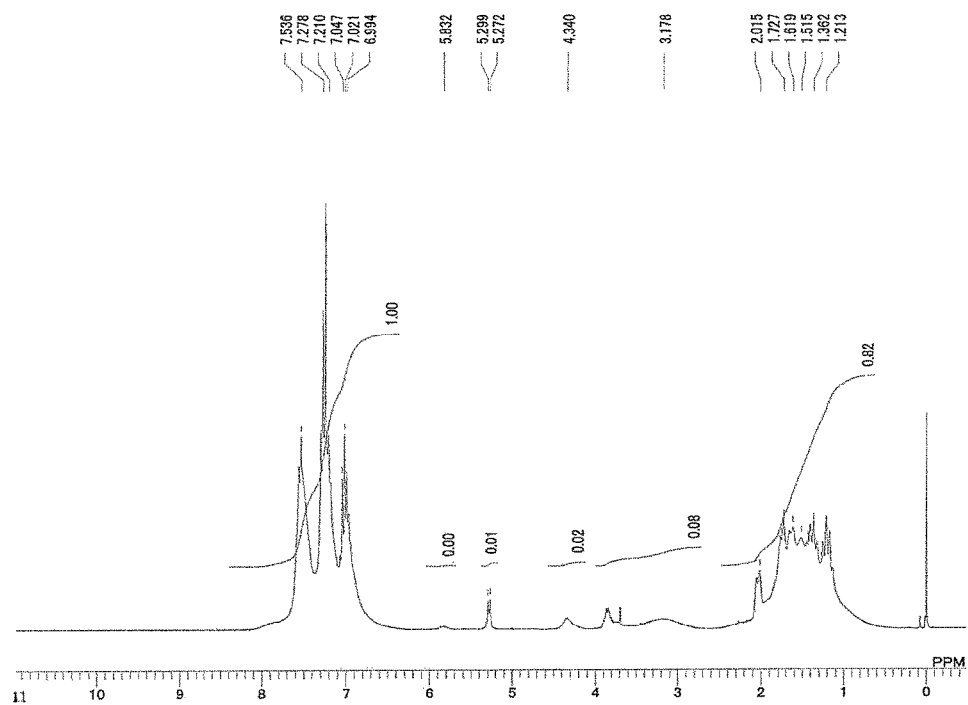
FIG. 21 is an $^1$H-NMR spectrum of the hyperbranched polymer [5] obtained in Example 13.

FIG. 21 shows the measured $^1$H-NMR spectrum for TC-250-2. The TC-250-2 thus obtained was a compound having structural units of formula (1). The polystyrene-equivalent weight-average molecular weight Mw of TC-250-2, as measured by GPC, was 1,200, and the polydispersity Mw/Mn was 2.31.

Measurement of Refractive Index

An amount of 1.0 g of the TC-250-2 obtained above was dissolved in 5.67 g of cyclohexanone, giving a clear yellow solution. Using a spin coater, the resulting polymer varnish was spin-coated onto a glass substrate for 5 seconds at 200 rpm and for 30 seconds at 1,500 rpm, following which the solvent was removed by a 5-minute bake at 250° C., thereby giving a film. The resulting film had a refractive index at 589 nm of 1.6753.

The invention claimed is:

1. A film consisting essentially of a triazine ring-containing hyperbranched polymer characterized by comprising a recurring unit structure of formula (1) below

[Chemical Formula 1]

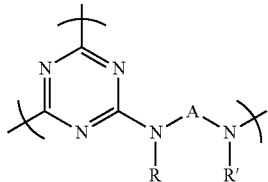

(1)

wherein R and R' are each independently a hydrogen atom or an alkyl, alkoxy, aryl or aralkyl group; and A is an alkylene group which may have an alicyclic structure of 1 to 20 carbons and is at least one moiety selected from the group consisting of moieties of formulas (2) to (14) below

(2)

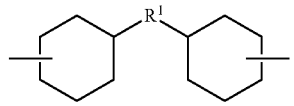

(3)

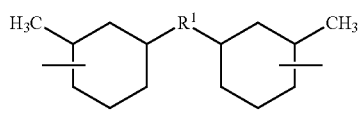

(4)

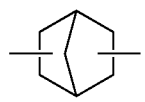

(5)

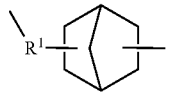

(6)

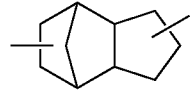

(7)

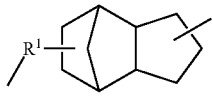

(8)

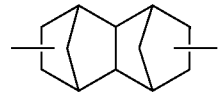

(9)

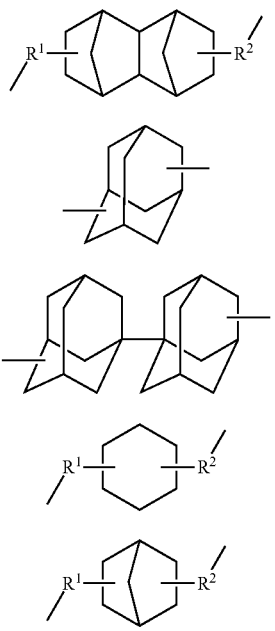

(10)

(11)

(12)

(13)

(14)

R¹ and R² being each independently an alkylene group which may have a branched structure of 1 to 5 carbons, and wherein the polymer is capped on at least one end by an alkyl, aralkyl, aryl, alkylamino, alkoxysilyl-containing alkylamino, aralkylamino, arylamino, alkoxy, aralkyloxy, aryloxy or ester group, wherein the hyperbranched polymer has a weight-average molecular weight of between 400 and 10,000.

2. The film according to claim 1, wherein A has formula (2).

3. The film according to claim 1, wherein the recurring unit structure of the polymer has formula (15) below

[Chemical Formula 3]

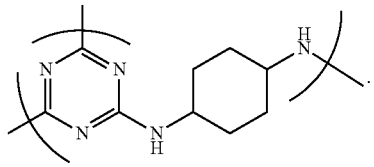

(15)

4. The film according to claim 1, wherein the recurring unit structure of the polymer has formula (16) below

[Chemical Formula 4]

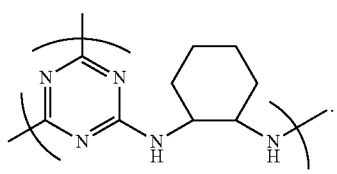

(16)

5. The film according to claim 1, wherein the polymer has at least one terminal triazine ring which is capped by an alkyl, aralkyl, aryl, alkylamino, alkoxysilyl-containing alkylamino, aralkylamino, arylamino, alkoxy, aralkyloxy, aryloxy or ester group.

6. An electronic device comprising a base material and the film of claim 1 formed on the base material.

7. An optical member comprising a base material and the film of claim 1 formed on the base material.

8. A solid-state image sensor formed of a charge-coupled device or complementary metal oxide semiconductor, which sensor comprises at least one layer of the film of claim 1.

9. A solid-state image sensor comprising the film of claim 1 as a planarization layer on a color filter.

\* \* \* \* \*